United States Patent [19]
Hirasaka

[11] Patent Number: 6,127,869
[45] Date of Patent: Oct. 3, 2000

[54] CIRCUIT FOR CALIBRATING DELAY LINES AND METHOD

[75] Inventor: Hisato Hirasaka, Kanagawa, Japan

[73] Assignee: Hewlett-Packard Company, Palo Alto, Calif.

[21] Appl. No.: 09/258,253

[22] Filed: Feb. 25, 1999

[30] Foreign Application Priority Data

Feb. 27, 1998 [JP] Japan .................................. 10-046610

[51] Int. Cl.[7] ....................................................... G01F 1/66
[52] U.S. Cl. ........................................... 327/261; 327/262
[58] Field of Search .................................. 327/261, 262, 327/263, 269, 270, 271, 284

[56] References Cited

U.S. PATENT DOCUMENTS

| | | | |
|---|---|---|---|
| 4,684,897 | 8/1987 | Richards et al. ........................ | 328/162 |
| 4,780,667 | 10/1988 | Reese, Jr. et al. ........................ | 324/83 |
| 5,317,219 | 5/1994 | Lupi et al. .............................. | 307/606 |

OTHER PUBLICATIONS

IEEE Transaction on Magnetics, vol 31, No. 1, Jan. 1995, pp. 816–819, Guo Mian, "An Algorithm for a Real Time Measurement of Nonlinear Transition Shift by a Time Domain Correlation Analysis".

IEEE Transaction on Magnetics, vol. 27, No. 6, Nov. 1991, pp. 4831–4833, J. Moon et al., "Nonlinear Effects of Transition Broadening".

VM65070 Analog PRML Channel, Feb. 1997, pp. 6–139, 6–168, "Advance Information".

*Primary Examiner*—Tuan T. Lam
*Assistant Examiner*—Linh Nguyen

[57] ABSTRACT

A circuit for calibration of the NLTS correction value provided for the NLTS correction circuit to realize its high precision of the amount of the NLTS correction. The circuit for calibrating the NLTS correction value of the present invention comprises a duty cycle-voltage converter (D/V converter) for receiving the output signals of the NLTS correction circuit and converting the duty cycle of the signals to voltage values, an A/D converter for converting the analog output from the D/V converter to digital values, and an delay line control device for controlling the amount of delay of each delay line in accordance with the output of the A/D converter. To providing the circuit for calibrating the NLTS correction value of the present invention for the NLTS correction circuit, the amount of delay of the delay lines is required to be controllable with the delay line control device. Additionally, by providing a frequency spectrum analyzer for analyzing frequency spectrum of the output from the recording amplifier, the calibration of the amount of the NLTS correction including the output from the recording amplifier is realized.

7 Claims, 21 Drawing Sheets

1801

CIRCUIT FOR CALIBRATING DELAY LINES AND METHOD

FIELD OF THE INVENTION

The present invention pertains to increasing the precision of calibration for an NLTS (non-linear transition shift) correction circuit. In particular, it relates to a circuit for calibrating the amount of delay of each delay line used in an NLTS correction circuit and its method.

BACKGROUND OF THE INVENTION

As shown in FIG. 1, magnetic recording devices, such as hard disk drives (referred to below as HDD), etc., are generally tested by writing data signals to be recorded on a disk 103 to be tested, through recording amplifier 101 and recording head 102. Thereafter, the data that has been written is read as regenerated signals through regeneration head 104 and regeneration amplifier 105, and these data are compared with the signals to be recorded. However, the peak position of the regeneration signals is displaced from the polarity transition point (transition) of the signals to be recorded due to the nonlinearity of this magnetic conversion system in magnetic recording devices, such as HDD, etc., (in other words, NLTS) Accordingly, the signals to be recorded must be corrected in order to cancel this phenomenon.

This phenomenon has been recognized as a significant factor that prevents from increasing the recording density of magnetic recording devices, such as HDD in particular. For instance, FIG. 2 shows the waveform of the signals to be recorded and the waveform of regeneration signals in the recording and regeneration system of the HDD of FIG. 1. Since the polarity transition distance of the signals to be recorded is relatively narrow between transitions C–D, adjacent transitions interfere with one another, resulting in NLTS. In this embodiment, the distance between the peaks of the regeneration signals is employed. On the other hand, the polarity transition distance between transitions A–B is relatively broad, and therefore, there is little interference between adjacent transitions and almost no NLTS is produced.

The NLTS correction circuit, which corrects the data to be recorded to cancel the NLTS that is expected during signal recording, is a well-known means for solving the problem. This NLTS correction circuit comprises a data pattern analyzer for analyzing the pattern of data to be recorded, which is designed in accordance with a prescribed table for converting the NLTS correction value for the pattern of data to be recorded. The data pattern analyzer estimates the amount and direction of NLTS produced between transitions C–D. This NLTS pre-corrects the signals to be recorded so that transitions C and D which include desired peak distance on regenerated signal at the bottom of FIG. 3 are obtained.

The table for converting the NLTS correction value of the data pattern will be explained hereafter. NLTS correction of HDD is usually performed based on intermediate data, which are converted from data to be recorded before they are recorded. There are various methods of accomplishing this conversion, an explanation will be made here by taking the intermediate data as an example that takes 1 in case there is a logical change in a bit value of a recording signal from its immediately preceding bit value and takes 0 in case there is no change. That is, the signals to be recorded are reversed when the logic of the intermediate data is 1. For instance, when part of a series of intermediate data is "10100110", the corresponding data to be recorded become "11000100," as shown in FIG. 2. Since transient shift is caused by the interference between contiguous logic is in the in termediate data to be recorded, it is understood that NLTS tends to happen at transients C and D in FIG. 2. In contrast, the amount of interference between the two transitions decreases as the distance between the transitions increases. Thus, assuming that the range in which the effect of the interference cannot be ignored is, for example, both the preceding and succeeding two bits of a transition, a table of "Data pattern-NLTS correction value" as shown in Table 1 is obtained in accordance with the above-described principle, by treating the combination of the data bit that is about to be recorded and its preceding two bits and succeeding two bits as one data pattern of five bits, and correlating each possible data pattern with its NLTS correction value. Only data patterns where the bit exactly in the middle is 1 can be treated by using this type of system and therefore, the number of rows in the table is reduced by half and the table is efficient. The amount of each NLTS correction varies with the characteristic of the recording medium that is the subject of the measurements and is determined by measuring the NLTS produced in regenerated signals with an HDD tester. Furthermore, the number of the delay line that should be selected for each data pattern is easily determined using the "NLTS Correction Value-Delay Line Number Table" (Table 2), which defines the number of the delay line that should be selected for each NLTS correction value. The data pattern analyzer operates in accordance with the "Data Pattern-NLTS Correction Value Table" and "NLTS Correction Value-Delay Line Number Table" obtained in this way.

TABLE 1

Data Pattern-NLTS Correction Value Table

| Data pattern | NLTS correction value (+ indicates delayed correction, - indicates advanced correction) |
|---|---|
| 00100 | 0 |
| 00101 | +100 ps |
| 00110 | +200 ps |
| 00111 | +220 ps |
| 01100 | −200 ps |
| 01101 | −150 ps |
| 01110 | 0 |
| 01111 | 0 |
| 10100 | −100 ps |
| 10101 | 0 |
| 10110 | +150 ps |
| 10111 | +100 ps |
| 11101 | −100 ps |
| 11100 | −220 ps |
| 11110 | 0 |
| 11111 | 0 |

TABLE 2

NLTS Correction Value/Delay Line Number Table

| NLTS correction value | Delay line number |
|---|---|
| −220 ps | 0 |
| −200 ps | 1 |
| −150 ps | 2 |
| −100 ps | 3 |
| 0 | 4 |
| +100 ps | 5 |
| +150 ps | 6 |

TABLE 2-continued

NLTS Correction Value/Delay Line Number Table

| NLTS correction value | Delay line number |
|---|---|
| +200 ps | 7 |
| +220 ps | 8 |

Data recording devices usually have a data buffer memory 401 (FIG. 4) for conversion of the nonsynchronized record data signals to be recorded from the host computer to signals having the data rate of the recording channel. Data that have been stored in data buffer memory 401 are read at a predetermined channel data rate from the channel clock and recorded on the medium by recording head 102 through recording amplifier 101.

FIG. 5 shows an example of NLTS correction circuit 500 of the prior art. This correction circuit of the prior art which is disposed between data buffer memories 401 and recording amplifier 101. This conventional NLTS correction circuit 500 comprises several delay lines $DL_0$–$DL_2$, a selector 502, which selectively switches the output of the delay lines, and a data pattern analyzer 503, which controls the selector 502. The delay line that delays the current data about to be recorded is selected and NLTS correction is performed for the data based on the analysis results of data pattern analyzer 503. The term "record data pattern" that is used here is defined as a series of numbers which is a section of the intermediate data. Although the way of conversion of the data to be recorded to intermediate data, varies with the HDDs and the HDD testers, for convenience, it is defined in this specification that record data is converted to intermediate data 506 by record data-intermediate data conversion circuit 508 before they are input to the shift register of the data pattern analyzer. Furthermore, the D-type flip-flop represented by reference 509 in FIG. 5 is used to match the timing of the data to be recorded and that of the intermediate data.

Specifically, data pattern analyzer 5.03 comprises shift register 504, which shifts intermediate data 506 for each predetermined channel clock, and decoder 507, which decodes the output from shift register 504. Shift register 504 comprises D-type flip-flops 505, and the number of its stages is determined by the number of preceding and succeeding bits on which the pattern analysis is to be conducted. In FIG. 5, five bits are the subject of the analysis, and there are therefore four stages of flip flops. Decoder 507 produces selector control signals based on a predetermined logic ("Data Pattern-NLTS Correction Value Conversion Table") in accordance with the pattern of the data to be recorded that is input and sends these signals to the selector. The selector control signal select a delay line so that the data signal that is about to be recorded may be corrected with the optimal delay.

The conventional method of correcting data to be recorded will be described while referring to the simple example in FIG. 5.

The intermediate data are shifted sequentially through shift register 504, which has four flip-flops 505, in response to the channel clocks. The logical output of each flip-flop in the shift register is named $F(-2)\ldots F(2)$ (provided that $F(2)$ is the logical value for the input of the first flip-flop of the first step). $F(0)$ is the intermediate data corresponding to the current data or data about to be recorded. Thus, shift register 504 is arranged such that preceding two bits (logic values $F(-2)$ and $F(-1)$ of the flip-flop) and succeeding two bits (logic values $F(1)$ and $F(2)$ of the flip-flop) exist therein with the current one in the center.

Logical values $F(-2)\ldots F(2)$ are input in parallel into decoder 507. The decoder determines whether correction of data about to be recorded $D(k)$ is necessary or not and the direction of the correction (delay/advance and the amount of correction) by monitoring the signals $F(-2)$ through $F(2)$. Then, the decoder transmits selector control signals to the selector so that the delay line through which the $D(k)$ signal about to be recorded passes will be selected in accordance with this amount of correction. FIG. 6 shows data $D(k)$ about to be recorded and its preceding and succeeding data series and a series of intermediate data $ID(k)$ corresponding to it. Correction is needed only for the leading edge transition (the leading edge transition $D(k)$ should be delayed and the leading edge transition $D(k+1)$ should be advanced) and no correction is needed for the rest. In case no correction is needed, the decoder activates switch S1 so that $DL_1$ will be selected that has the medium delay.

On the first phase correction of transition, which is the leading transition of $D(k)$ in FIG. 6, the value of
$$\{F(-2)\ldots F(2)\}=\{ID(k-2), ID(k-1), ID(k), ID(k+1), ID(k+2)\}=\{0, 0, 1, 1, 0\}$$
is input to the decoder. If the decoder logic is such that S2 is activated when the data pattern "00110" is input, the leading transition of $D(k)$ will pass through $DL_2$ which has a longer delay time, and $D(k)$ will be recorded as delayed data $D(k)'$. On the second phase correction of transition, which is the leading transition of $D(k+1)$ in FIG. 6, the value
$$\{F(-2)\ldots F(2)\}=\{ID(k-1), ID(k), ID(k+1), ID(k+2), ID(k+3)\}=\{0, 1, 1, 0, 0\}$$
is input to the decoder. If the decoder logic is such that switch S0 is activated when data pattern "01100" is input, the leading transition of $D(k+1)$ will pass through $DL_0$, which has a shorter delay time, and $D(k+1)$ will be recorded as data $D(k+1)'$ to which an advancing correction has been applied. Thus, the transition of the signals about to be recorded is corrected by an amount of correction that is selected according to the logical value of the past and future several bits of data.

Data pattern analyzer 503 operates as described above, but logical modification of the number of stages in shift register 504 and decoder 507 is inevitable in the following cases:

(1) when characteristic of the head and recording medium have changed;

(2) when recording density is changed;

(3) when the conversion table (Table 1) is required to be modified dynamically as a result of changes in the characteristic of the head or recording medium.

As the recording density of the medium is reduced, the NLTS correction value also decreases. For example, the channel clock frequency is constant in conventional technique. Therefore, if the recording medium is a disk, the recording density of outer tracks is lower than that of inner tracks, which requires logic modification for each tracks. With respect to the fluctuations in the characteristics of the heads and the recording media, they are caused by, for heads, the degradation in time and by, for recording media, fluctuations in the maximum recording density in the test where exchanges of different types of media are done and the test where there are variations in the performances of the instances of a type of recording medium. In such cases, the conversion table is required to be modified according to the fluctuations. In particular, when the recording medium is tape, the medium and head are brought into contact with one another by scanning and therefore, the head becomes worn and degradation takes place over time. In case a medium is exchangeable as with a floppy disk, the NLTS characteristics vary depending on the individual medium.

Because the shift register and the decoder are driven at the channel clock rate that is of too high frequency for a CPU to respond to, they are implemented solely with hardware. Thus, modification of the logic becomes difficult. There is a means for changing decoder logic using a PLD (programmable logic device), but because of problems with operating speed, it is necessary to simulate the operating speed of the logic circuit in order that the PLD may be driven at a high-speed data rate. Thus, inexpensive and simple modification of logic is substantially impossible.

Next, with regard to the problem of the precision of NLTS correction in the prior art, first of all, difficulty of establishing NLTS correction precision required by the NLTS correction circuit will be discussed.

In the case of an HDD, the NLTS correction value, when recording density has been increased to its limit, can be regarded as 20% of the channel clock period or less. This is caused by the fact that the regeneration error rate increases and practical use is impossible under a high recording density requiring this much NLTS correction or more. On the other hand, progress has been made in high-speed transfer, with the standard transfer rate being a channel rate of 500 Mbps on the development. Therefore, the precision and resolution of the desired NLTS correction value is calculated as shown in Table 3 below:

TABLE 3

Desired precision and resolution of the NLTS correction value

| | |
|---|---|
| Channel clock frequency, fch | 500 MHz (channel rate 500 Mbps) |
| Channel period, T | 2000 ps (T = 1/500 MHz) |
| Maximum NLTS correction value, Tc_max | 400 ps (2000 ps × 20%) |
| NLTS correction resolution, Tc_res | 20 ps (2000 ps × 1%) |
| Precision of the NLTS correction ± value, Tc_prec | 10 ps |

Consequently, the following problems are encountered with NLTS correction precision:

(1) It is difficult to produce high-precision delay lines with a precision of ±10 Ps at a maximum delay of 400 Ps and a resolution of 20 ps.

(2) When semiconductor delay lines are used, a change in the amount of delay of as much as ±10% is unavoidable, depending on the temperature characteristic of the semiconductor.

(3) When passive delay lines are used, stability is much better than with semiconductor delay lines because of changes in temperature, but it is difficult to obtain delay lines with 20 Ps tracks of 400 Ps, 380 Ps, 360 Ps, . . . , 40 Ps, 20 Ps.

(4) Even if problems 1 and 2 are solved, since the (n+1) to 1 selector (shown by reference 502 in FIG. 5) has n+1 input wiring with different positions, the difference in the wiring length within the selector as well as the difference in the length of the wiring in the printed pattern inevitably leads to a difference in delay of several 10 Ps.

(5) When a resolution of 20 Ps is made with a digital counter, the counter clock is calculated on 50 GHz (1/20 Ps 50 GHz), which makes practical use difficult.

These problems are significant to NLTS measurement. This is because a flexible response to various pattern analysis algorithms and very precise NLTS correction are needed for NLTS instrumentation.

Consequently, an object of the present invention is to realize a circuit for high precision calibration of the amount of delay of each delay line that is used in an NLTS correction circuit and its method.

SUMMARY OF THE INVENTION

By providing a circuit for calibration of the NLTS correction value which uses a delay line calibration circuit of the present invention, the NLTS correction circuit whose precision of the amount of correction is improved is realized. The circuit for calibrating the NLTS correction value of the present invention comprises a duty cycle-voltage converter (D/V converter) for receiving the output signals of the NLTS correction circuit and converting the duty cycle of the signals to voltage values, an A/D converter for converting the analog output from the D/V converter to digital values, and an delay line control device for controlling the amount of delay of each delay line in accordance with the output of the A/D converter. To providing the circuit for calibrating the NLTS correction value of the present invention for the NLTS correction circuit, the amount of delay of the delay lines is required to be controllable with the delay line control device. Additionally, by providing a frequency spectrum analyzer for analyzing frequency spectrum of the output from the recording amplifier, the calibration of the amount of the NLTS correction including the output from the recording amplifier is realized.

BRIEF DESCRIPTION OF THE DRAWINGS

The present invention will be more apparent from the following description of the preferred embodiment when taken in conjunction with the accompanying drawings. Furthermore, the elements with the same reference numbers in the figures have the same function throughout all of the figures.

DEFINITION OF SYMBOLS

Figure 1:
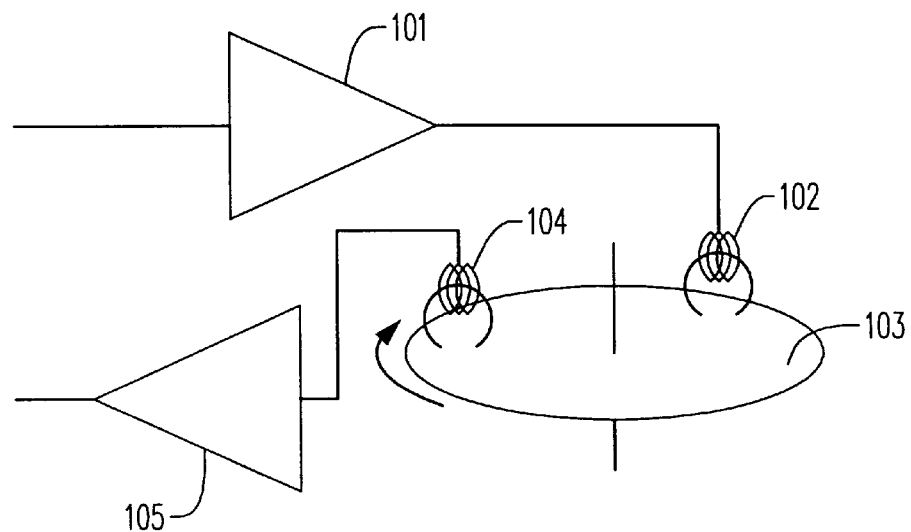
FIG. 1 is a schematic diagram of the recording and regenerating system of an HDD.
Figure 2:
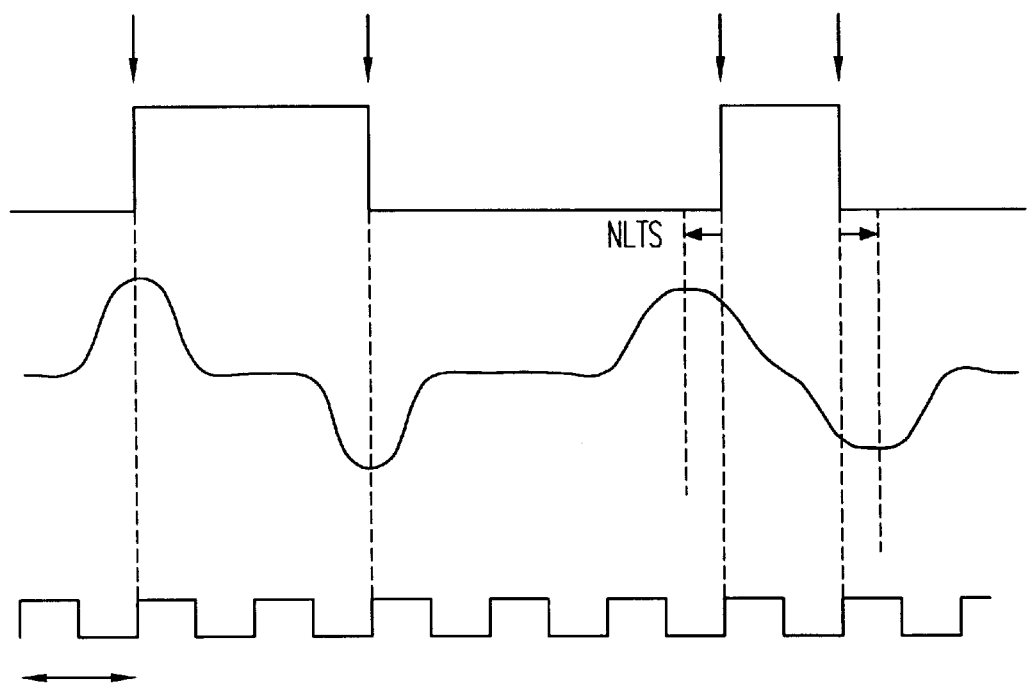
FIG. 2 is a schematic illustration showing the waveform of signals to be recorded and regeneration signals of an HDD.

101: Recording amplifier
102: Recording head
401: Data buffer memory
501: Delay lines
502: Selector
701: Data pattern analyzer
702: Selector control signals buffer memory
703: NLTS correction circuit

DETAILED DESCRIPTION OF THE INVENTION

Figure 7:
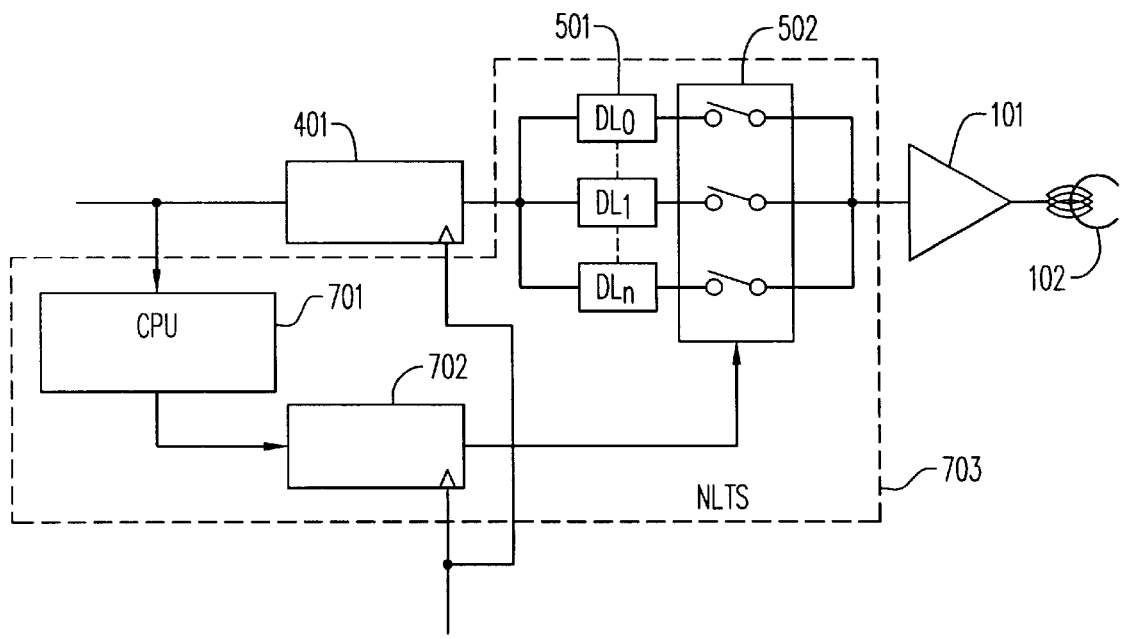
FIG. 7 is a block diagram of a preferred embodiment of the NLTS correction circuit of the present invention.

FIG. 7 is an embodiment of the NLTS correction circuit of the present invention. By means of NLTS correction circuit 703 of the present embodiment, data to be recorded that have been sent from a HDD tester are loaded in data pattern analyzer 701. Actually, in order to analyze the pattern of the data to be recorded, the data are loaded into data pattern analyzer 701 in a form where they have been converted to intermediate data. In order to simplify the following explanation, the intermediate data will simply be referred to hereafter as "data to be recorded". Consequently, "data to be recorded" that are analyzed by data pattern analyzer 701 in each embodiment described bellow are the data to be recorded that have been converted to intermediate data. The data to be recorded are analyzed by data pattern analyzer 701 and selector control signals are generated. The generated signals are output to selector control signal buffer memory 702. Selector control signal buffer memory 702 is synchronized with the output of the data buffer memory by the channel clock and outputs selector signals to selector 502. This is the same as in the other embodiments described bellow. The data pattern analyzer 701 may be provided by using a CPU programmed to process the data to be recorded and determine the selector control signals. Alternatively, a computer that is separate from NLTS correction circuit 703 may be used for determining the selector control signals. In this way, pattern analysis can be performed with software and the analysis algorithm can be easily changed.

Figure 31:
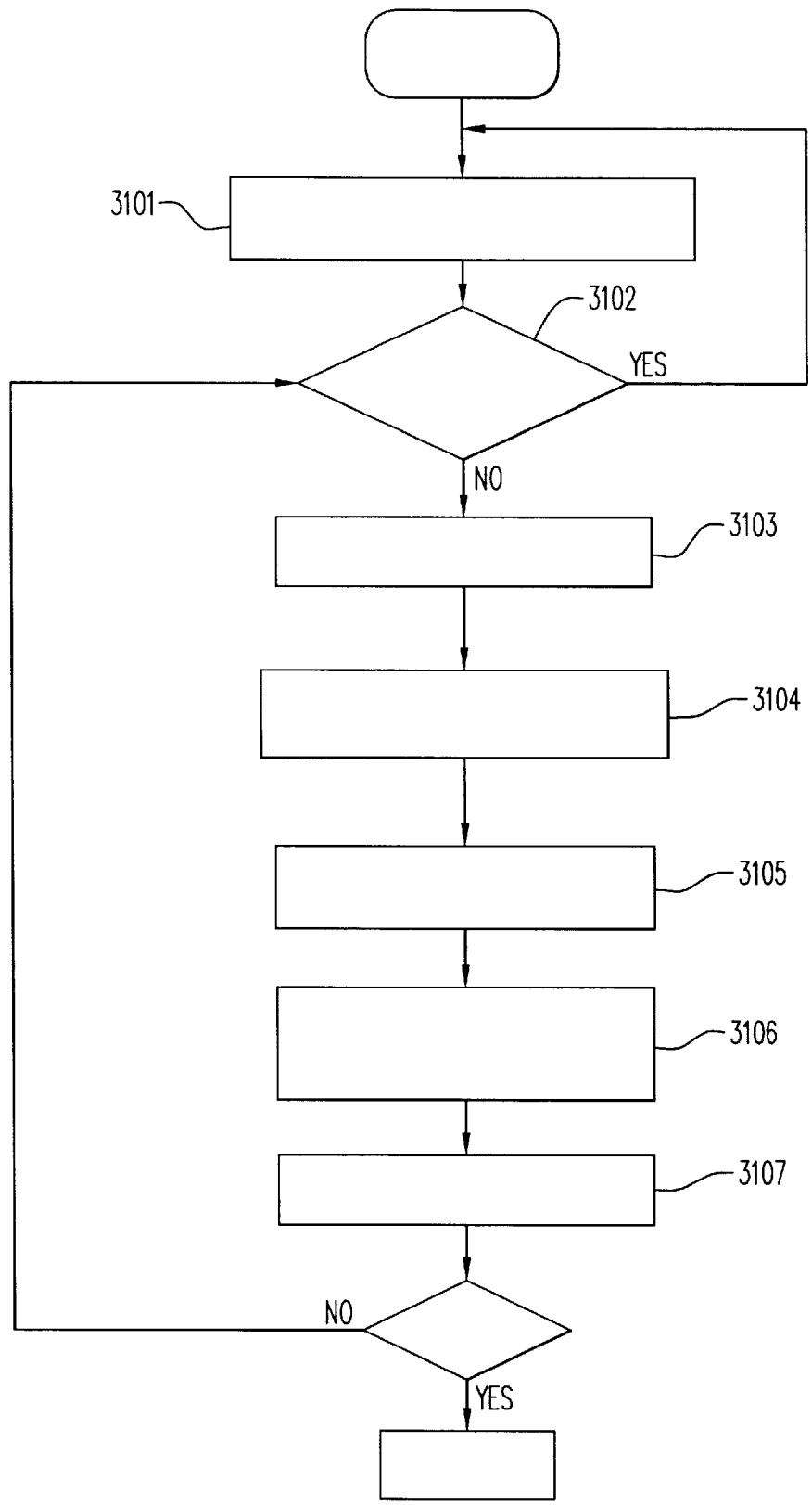
FIG. 31 is a diagram for explaining the algorithm of the analysis program installed in data pattern analyzer 701.

Now, the algorithm of the analysis program loaded in data pattern analyzer 701 will be explained referring to FIG. 31. FIG. 31 is a flow chart for explaining the analysis program loaded in data pattern analyzer 701 of the NLTS correction circuit of the present invention.

First, a predetermined amount of data is picked to be analyzed from the series of data to be recorded (3101). For example, when both the preceding and succeeding two bits of the data about to be recorded and itself are to be analyzed, as with the data pattern in the "Data Pattern-NLTS Correction Value Table" shown in Table 1, data consisting of 5 bits are picked from the series of data. The same case of analyzing data in 5-bit units is discussed below. Next, the system evaluates whether the center bit in the 5-bits section that has been picked from the series of data is 0 (3102). If the center bit is 0, transition has not occurred and therefore, correction is not necessary. If the center bit is not 0, the data pattern that matches this pattern is found in the "Data Pattern-NLTS Correction Value Table" in Table 1 and the corresponding NLTS correction value is determined (3104). Next, the delay line number that corresponds to this NLTS correction value is determined from the "NLTS Correction Value-Delay Line Number Table" in Table 2 (3105). This delay line number data is sent to selector control signal buffer memory 702 (3106). Selector 502 is controlled by the delay line number data, which selector control signal buffer memory 702 outputs in accordance with the channel clock, and selects each delay line $DL_0$–$DL_n$. Next, the data to be recorded are shifted by 1 bit (3107) and the aforementioned procedure is repeated until recording is completed.

Figure 8:
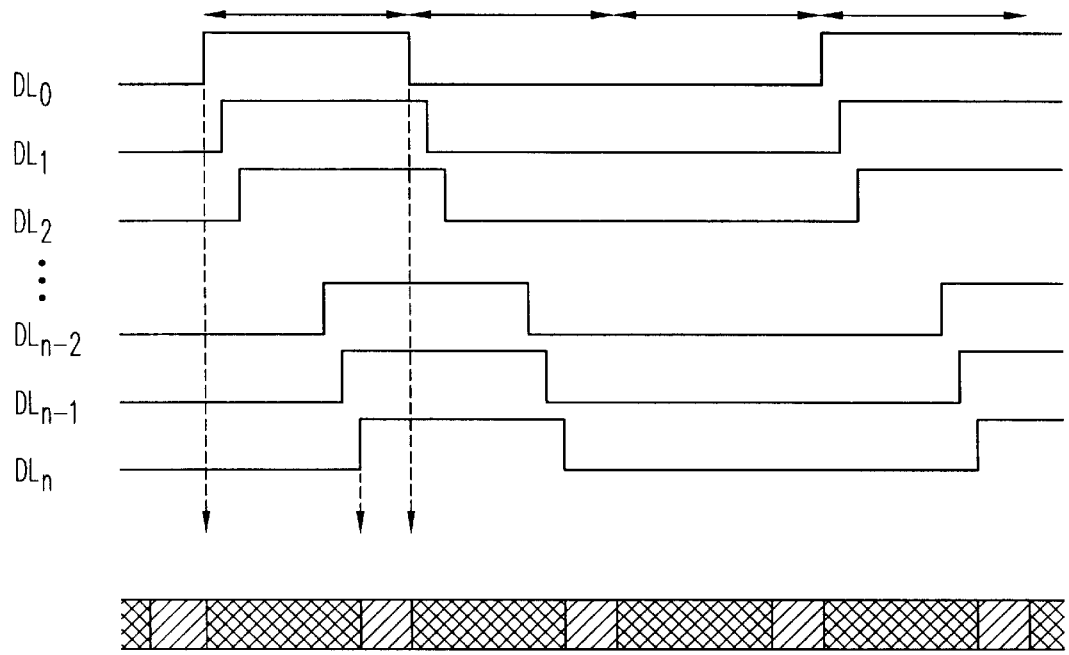
FIG. 8 is a diagram representing the timing chart of the output of each delay line and the selector timing hazard in the NLTS correction circuit in FIG. 7.

The timing chart for the output of each delay line in the embodiment shown in FIG. 7 is as shown in FIG. 8. Although the selector selects from delay lines $DL_0$ through $DL_n$ for each channel period, it should be timed avoiding the period from the minimum delayed transition time to the maximum delayed transition time of by the delay lines. (The period where this switching operation of delay lines is prohibited is referred to below as the "timing hazard".), because at least one output of all of the delay lines is changing within this period.

FIG. 8 shows the delay line output waveform and the selector-operable timing in an example where it is assumed that the relationship between the amount of delay of each delay line is $$DL_0 < DL_1 < \ldots < DL_i < \ldots < DL_{n-1} < DL_n$$

The cross-hatched parts in FIG. 8 show the period from the minimum delayed transition time to the maximum delayed transition time by the delay lines. The operable timing of the selector in the first example is narrow, as shown by the oblique line shading in FIG. 8, in order to avoid this region (timing hazard). This means that when the NLTS correction value is increased to approximately the channel period T, the timing by which the selector is switched becomes narrower.

Figure 9:
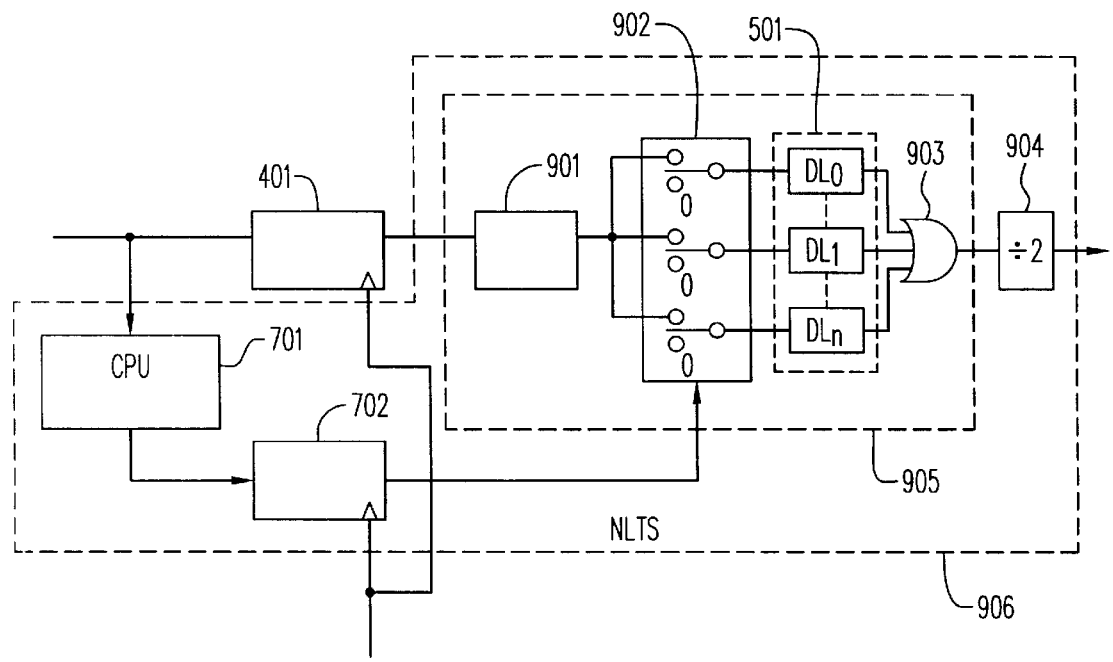
FIG. 9 is a block diagram of an er embodiment of the NLTS correction circuit of the present invention.
Figure 10:
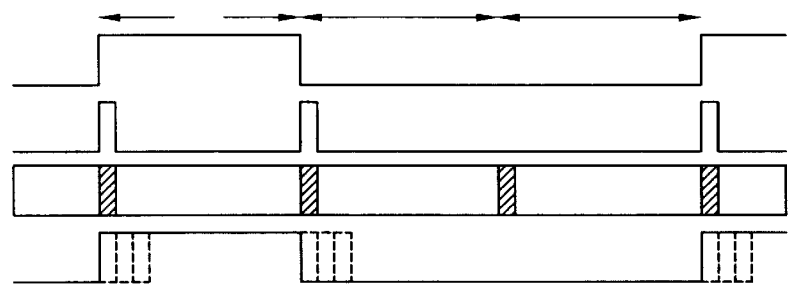
FIG. 10 is a diagram representing the timing chart that shows the output of each element and the selector timing hazard of the embodiment of the NLTS correction circuit in FIG. 9.

FIG. 9 is a figure showing a second embodiment of the NLTS correction circuit of the present invention where there is sufficient timing for switching the selector in the first embodiment, and FIG. 10 is a figure for explaining the timing of this switching operation. Transition pulse generator 901 receives output from data buffer memory 401 and generates transition pulses when transition of this output occurs. The transition pulse directly affects the timing hazard, which is discussed later, and therefore, the pulse should be as narrow as possible. A transition pulse with a pulse width of 400 ps is used in the present embodiment and may be provided by a high-speed ECL logic element. Improved selector 902 inputs the transition pulses that have been generated by transition pulse generator 901 to any of $DL_0$ through $DL_n$. The logic low (0) is input as the non-transition signal to the delay lines that have not been selected. An OR operation of output of all of the delay lines is performed by OR circuit 903. This output is further frequency divided in half by ½ frequency divider 904 to obtain NLTS-corrected data signals. These NLTS-corrected signals are configured have waveform where the logic polarity is reversed on every rising edge of the transition pulse.

In the present embodiment [FIG. 9], selector 902 is arranged before the delay line 501 and therefore, this timing hazard is the period shown by the cross-hatching in FIG. 10 and is the same as the width of the transition pulse. Consequently, if the transition pulse is narrow enough in comparison to channel period T, the timing hazard will be reduced by a corresponding amount and will be sufficiently improved in comparison with the first embodiment.

Figure 11:
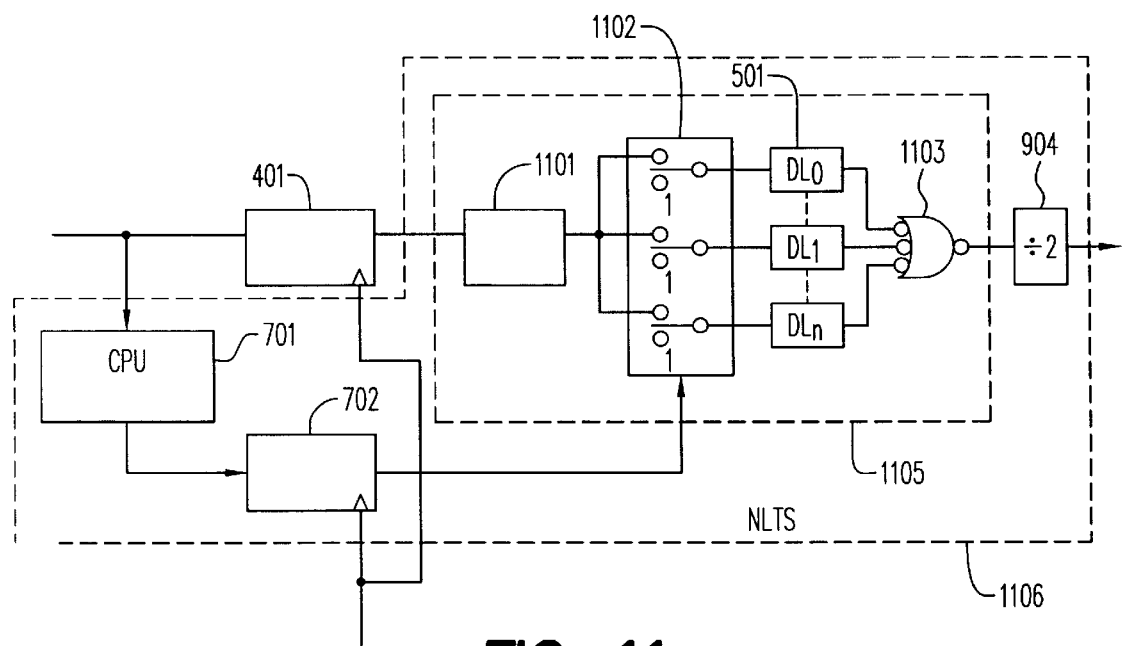
FIG. 11 is the block diagram of another embodiment of the NLTS correction circuit of the present invention.

In the second embodiment, the polarity of the transition pulse is positive, but the same results as with a transition pulse of negative polarity are obtained. FIG. 11 shows a embodiment of this (third embodiment). However, selector 102 is constructed so that the logic high (1) is input as the non-transition signal into the delay lines that have not been selected. Moreover, logic AND circuit 1103 is used in place of logic OR circuit 903 and is constructed so that the result of performing an AND operation on the output of all delay lines is input into ½ frequency divider 904. The rest operation is the same as in the second embodiment.

Figure 12:
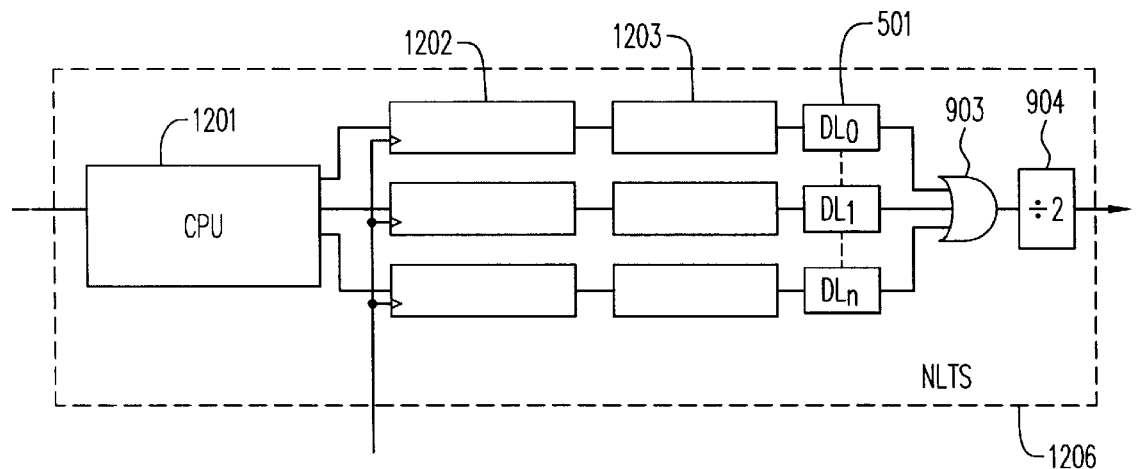
FIG. 12 is the block diagram of another embodiment of the NLTS correction circuit of the present invention.

In the aforementioned third embodiment, selector timing hazard is considerable, but this timing hazard can be completely eliminated in the fourth embodiment, shown in FIG. 12. As shown in FIG. 12, selector control signal buffer memory 702 and the selector are omitted from the structure of the aforementioned embodiment. As many data buffer memories 1202 and transition pulse generators 1203 as there are delay lines 501 are arranged, so that there is one memory and pulse generator for each delay line. Moreover, each data buffer memory is driven by the same channel clock. In this embodiment, the same results are obtained, even if the position of transition pulse generator 1203 and delay line 501 is changed as in FIG. 13.

The operation of the present embodiment will be described in detail while referring to FIGS. 14 through 16.

Figure 16:
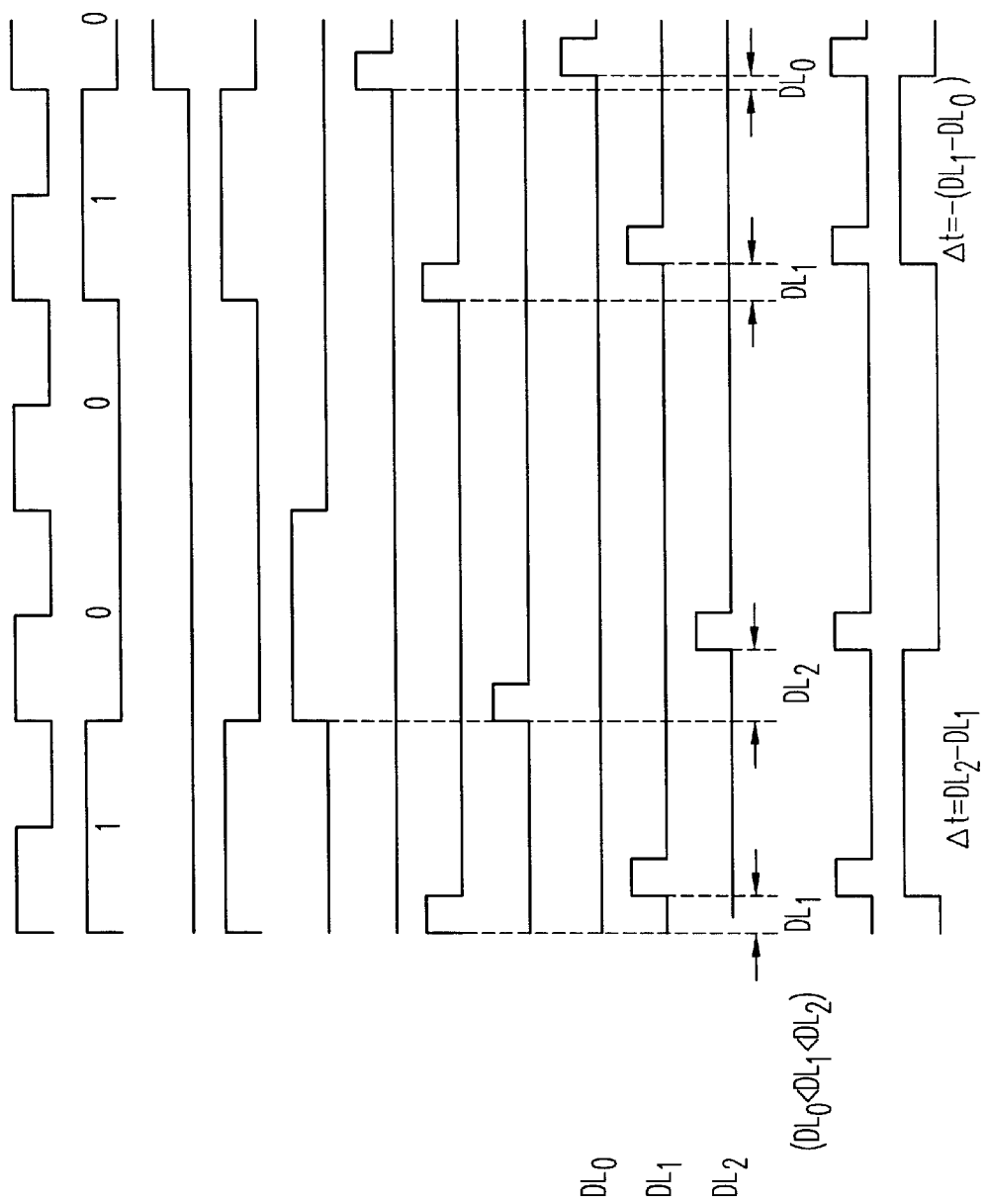
FIG. 16 is a timing chart of the output of each element for explaining the operation of the embodiment of an NLTS correction circuit shown in FIGS. 12 and 13.

The conditions in the example shown in FIG. 16 are as listed below:

Pattern of data to be recorded: 10010

The first "1" has a width that is wider than the original data pattern by delta–$t=DL_2-DL_1$ ("delta-" means the Greek letter delta.)

The second "1" has a width that is narrower than the original data pattern by delta–$t=DL_1-DL_0$.

$$DL_0 < DL_1 < DL_2$$

Figure 14:
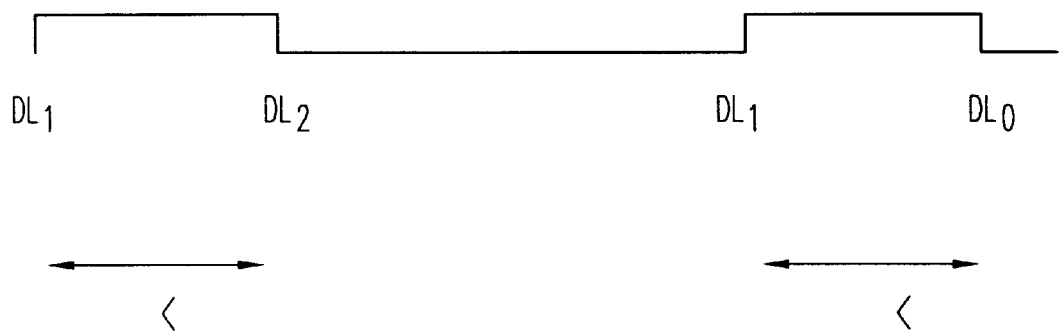
FIG. 14 is the schematic diagram showing the relationship between each transition in the signals to be recorded and the corresponding delay line in order to explain the embodiment of the NLTS correction circuit in FIGS. 12 and 13.
Figure 15:
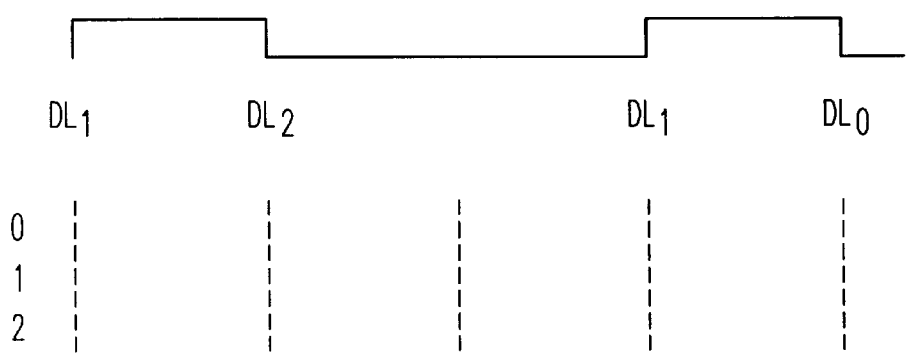
FIG. 15 is the schematic diagram showing the relationship between each transition in the signals to be recorded and the output of the corresponding delay line and each data buffer memory in order to explain the embodiment of the NLTS correction circuit shown in FIGS. 12 and 13.

Relationship between each transition and the delay line that should be selected under the aforementioned conditions is shown in FIG. 14.

In the present embodiment, each data buffer memory 1202 plays a role in switch, whereby the state of the next delay line 501 is switched to an active or an inactive state. That is, the data pattern to be output from each data buffer memory 1202 is determined by the respective data pattern analyzer 1201, so that the signals which is output through each delay line and transition pulse generator result in signals having a transition pulse that has been delayed by a desired amount. The determined data pattern is stored in the respective data buffer memory 1202. Thus, the relation between each transition in the record data signals and the data pattern stored in each memory under the aforementioned conditions are as shown in FIG. 15.

In short, data pattern analyzer 1201 of the present embodiment is programmed to produce data patterns for generating the transition pulse whose amount of delay has been corrected so that the signal having the transition in FIG. 14 can be output as the record data signal, for each corresponding delay line, and each data pattern is supplied to the respective data buffer memory 1202.

FIG. 16 shows the output waveform of the data buffer memories 0–2, transition pulse, and output waveform of each delay line that were produced under the aforementioned conditions. The transition pulses are delayed by the corresponding delay line. The output of the delay lines are then tied up in one signal by OR circuit 903 and the frequency is divided in half. The product is output as NLTS-corrected record data signal "10010". As shown in FIG. 16, it is apparent that the corrected record data signals have a first "1" that is wider than the record data signal prior to correction by delta–t=$DL_2$–$DL_1$, and the second "1" is narrower by delta–t=($DL_1$–$DL_0$). No timing hazard of the selector is produced when this method is used.

Consequently, the flow of operation in the present embodiment is as follows:

(1) Several data patterns determined by a predetermined program are selected from desired record data to be recorded.

(2) Several data patterns that have been selected are stored in the respective data buffer memory.

(3) Each data pattern stored in the memories is output synchronized with one another from the several data buffer memories.

(4) The synchronized signals that have been output are delayed by the corresponding amount of delay and converted to pulse signals that will generate the pulse when the transition is produced in the respective signal.

(5) An OR operation is performed on the several pulse signals that have been converted and the resulting values are further submitted to ½ frequency divided.

Figure 13:
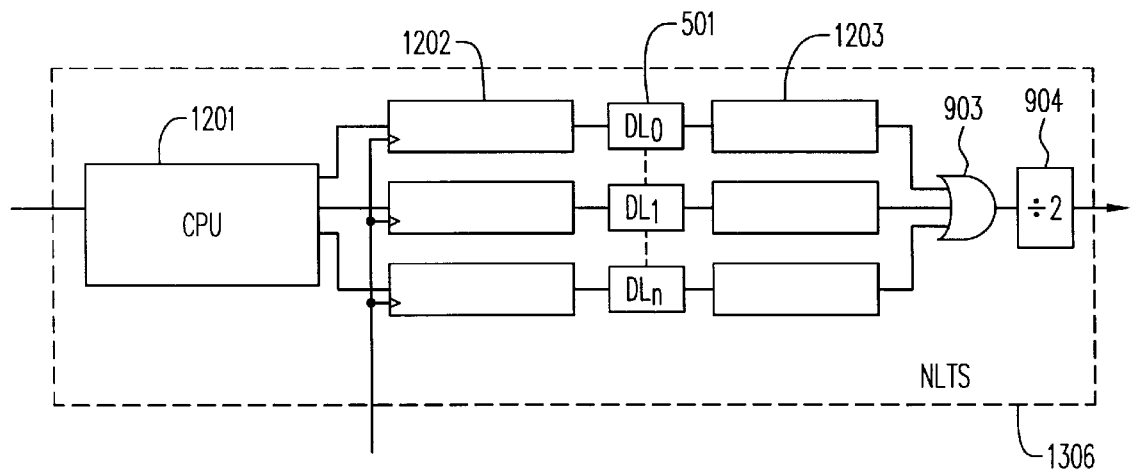
FIG. 13 is the block diagram of another embodiment of the NLTS correction circuit of the present invention.
Figure 17:
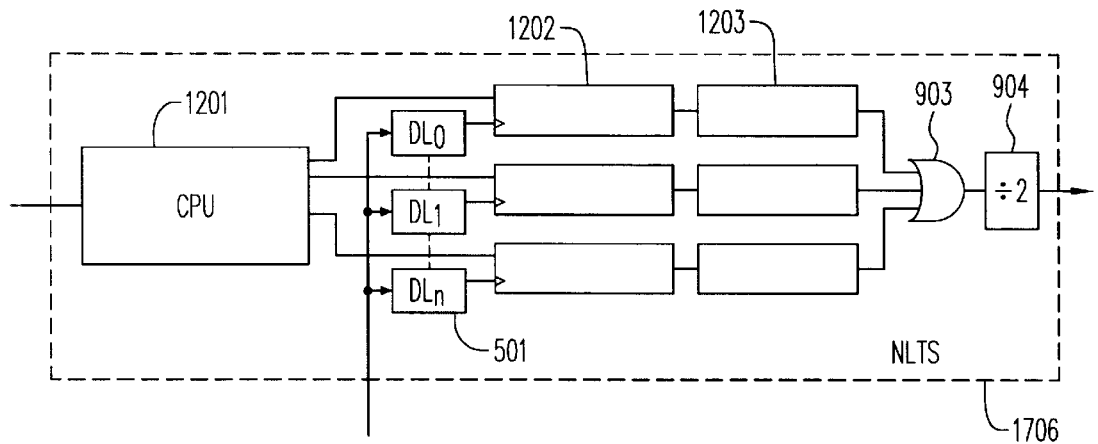
FIG. 17 is a block diagram of another embodiment of the NLTS correction circuit of the present invention.

The aforementioned is an embodiment of delay lines arranged after the data buffer memory. Alternatively delay lines may be arranged so that the channel clock that feeds to each data buffer memory is delayed, as shown in FIG. 17. It is obvious to those skilled in the art that even if this type of structure is used, a transition pulse that is delayed by the same amount as in the embodiments in FIGS. 13 and 14 is obtained.

Figure 18:
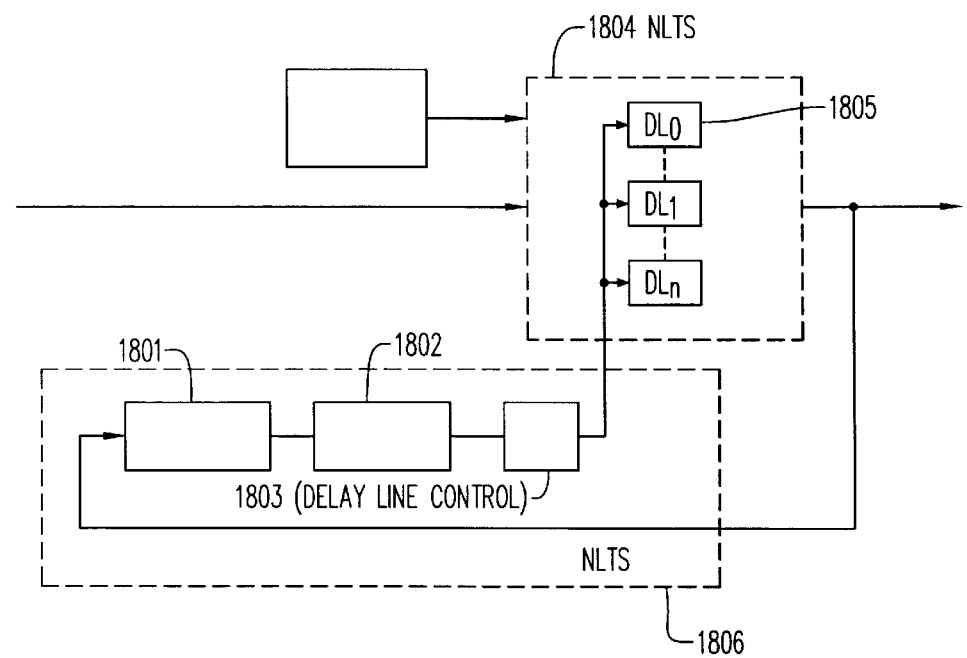
FIG. 18 is a block diagram of another embodiment of the NLTS correction circuit comprising the circuit for calibrating the amount of NLTS correction of the present invention.

Next to be described is circuit 1806 for calibrating the NLTS correction value, which can be added to the NLTS correction circuit of the aforementioned embodiments. FIG. 18 is a block diagram of the NLTS correction circuit having circuit 1806 for calibrating the NLTS correction value. The circuit for calibrating the NLTS correction value of the present invention is characterized by the fact that the transition time is detected from the duty cycle of the signals to be recorded, which is owing to the fact that the duty cycle also changes as the transition time changes.

Figure 32:
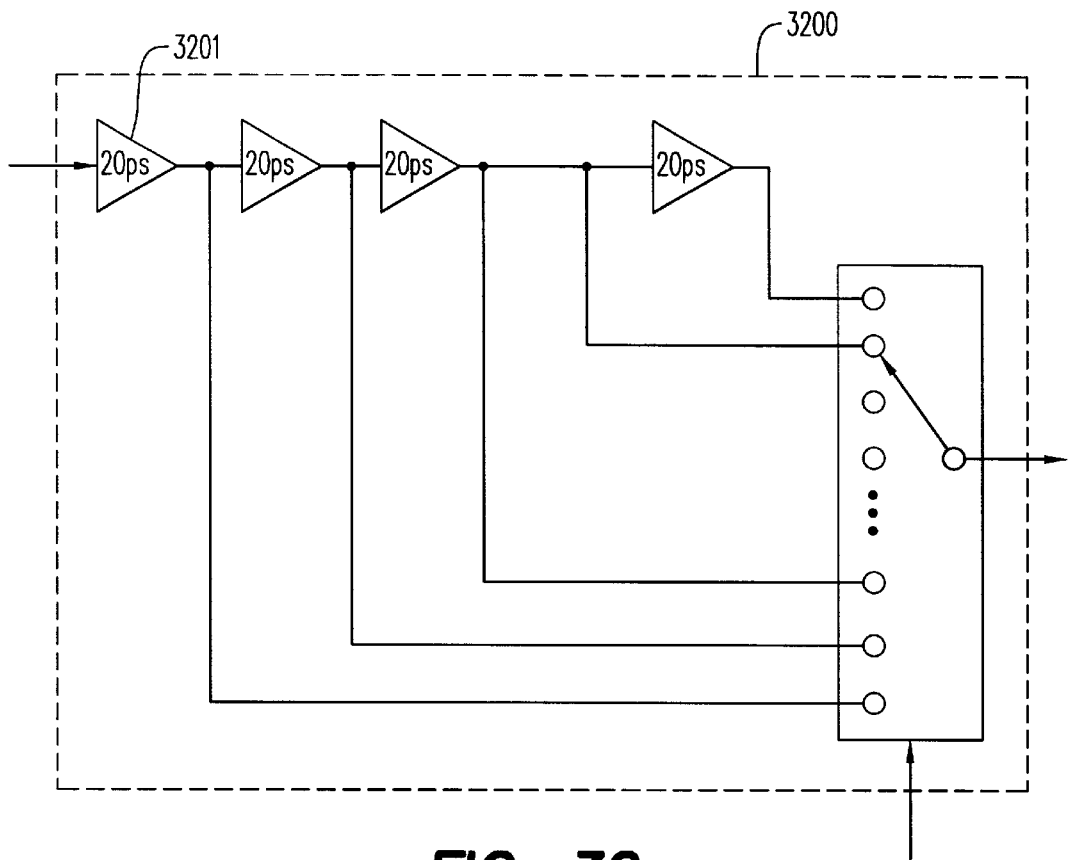
FIG. 32 is a block diagram that shows semiconductor delay lines whose delay volume can be controlled.

As shown in FIG. 18, the circuit for calibrating the NLTS correction value comprises duty cycle-voltage converter 1801 (referred to below as D/V converter), A/D converter 1802, and delay line control device 1803. Delay line control device 1803 comprises, for instance, a CPU and a decoder, and is used to control the amount of delay of each delay line. The CPU can also serve as the CPU that is used for the data pattern analyzer 701. In the present invention, the amount of delay of each delay line $DL_0$–$DL_n$ is required to be controllable by signals from delay line control device 1803. For example, semiconductor delay line 3200 may be used, as shown in FIG. 32. Several delay cells 3201 are arranged in series within the semiconductor delay lines. Selector 3202 within the delay lines inputs the delay line control value and selects the number of connected delay cells. Thus, the amount of delay is set. For instance, in the example in FIG. 32, there are series 100 delay cells whose amount of delay is 20 ps for each, so that the total amount of delay can be set to every 20 ps within a range of 20 ps to 2,000 ps. In the present invention, selector 3202 within this delay line is controlled by delay line control device 1803 during the process of calibrating the NLTS correction value.

Figure 33:
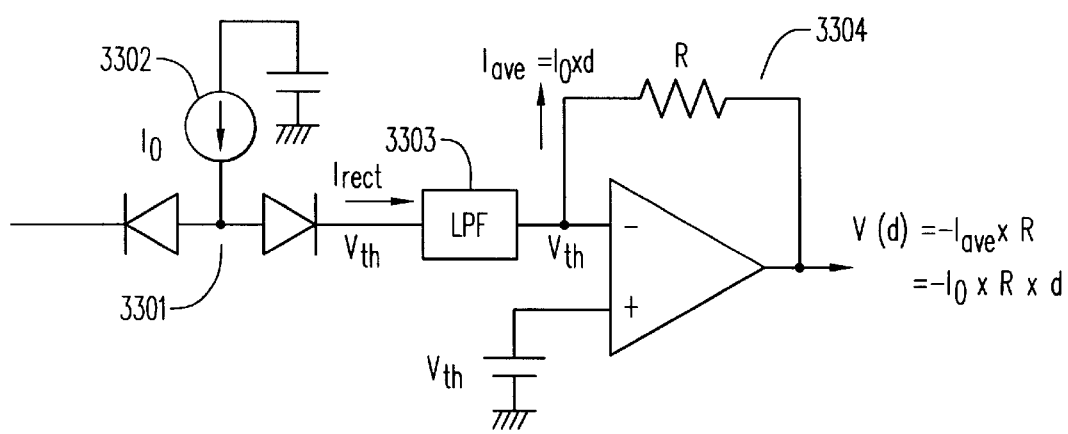
FIG. 33 is a block diagram of an embodiment of the D/V converter of the present invention.
Figure 34:
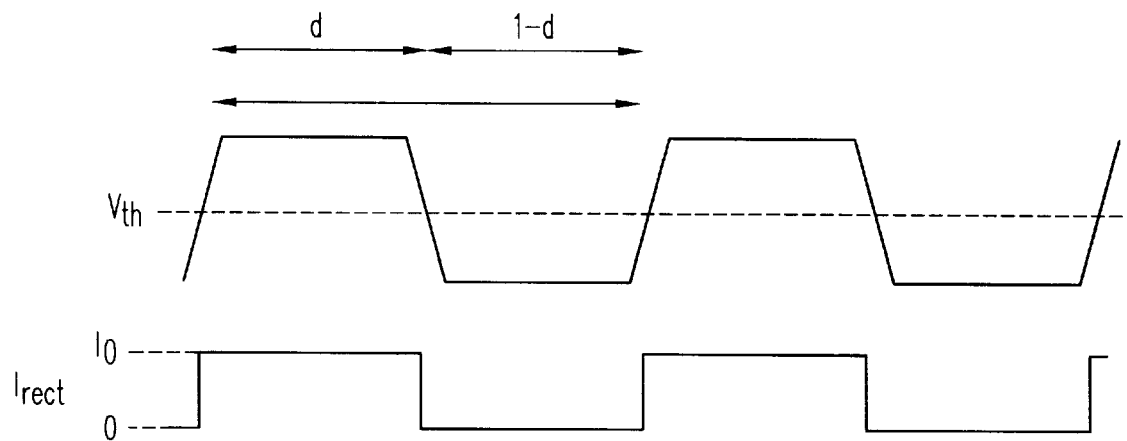
FIG. 34 is a diagram showing the input-output signals of the D/V converter of the present invention.

D/V converter 1801 is used to convert the duty cycle of the record data signals that is returned as feedback from the output of NLTS correction circuit 1804 to voltage value. Although any conventional converter may be employed as said D/V converter 1801, but in the present invention, circuit shown in the block diagram in FIG. 33, for instance, is used to improve linearity. D/V converter 1801 of the present invention comprises diode comparator 3301 of a pair of diodes, reference current source 3302, low-pass filter 3303, and current-voltage converter circuit 3304. The diodes operate as a comparator and a switch with $V_{th}$ as the threshold. Thus, reference current $I_0$ flows ($I_{rect}$) through low-pass filter 3303 only when the input signals are greater than $V_{th}$. The waveform of current $I_{rect}$ that flows through this low-pass filter becomes the waveform shown in FIG. 34. $I_{rect}$ is smoothed by low-pass filter 3303 to produce current $I_{ave}$ represented by the following formula:

$I_{ave} = I_0 \times d$ (d is the duty cycle of the input signals.)

This is converted to voltage V(d), which is represented by the following formula, by current-voltage converter circuit 3304.

$V(d) = -I_{ave} \times R$ $= -I_0 \times R \times d$

Reversal of the code can be accomplished by installing a reversal amplifier with a gain of –1 in the next step. Moreover, V(d) can be easily converted to function V(t) of the transition time t by the relationship between the period of the input signals and duty cycle d.

Incidentally, it is preferred that diode pair 3301 be a high-speed Schottky diode. As a result, the ON/OFF switching speed of the $I_{rect}$ will be very fast and consequently, the precision of the D/V converter can be improved. Moreover, A/D converter 1802 converts the voltage produced by D/V converter 1801 to digital signals that can be processed by delay line control device 1803.

The calibration target voltage V(t) corresponding to the calibration target t of the difference in the amount of correction between each delay line (that is, difference in delay times) is determined by a calibration algorithm, which will be described below, and each delay line is controlled by delay line control device 1803 so that the difference in the control volume between each delay line is equal to the calibration target.

Figure 19:
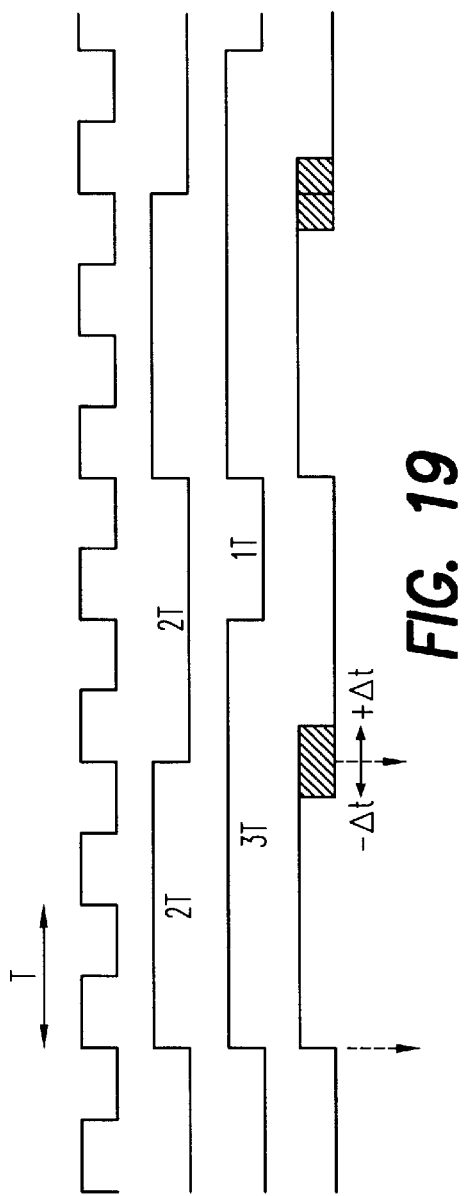
FIG. 19 is a diagram for explaining the calibration algorithm of the circuit for calibrating the amount of NLTS correction shown in FIG. 18.
Figure 35:
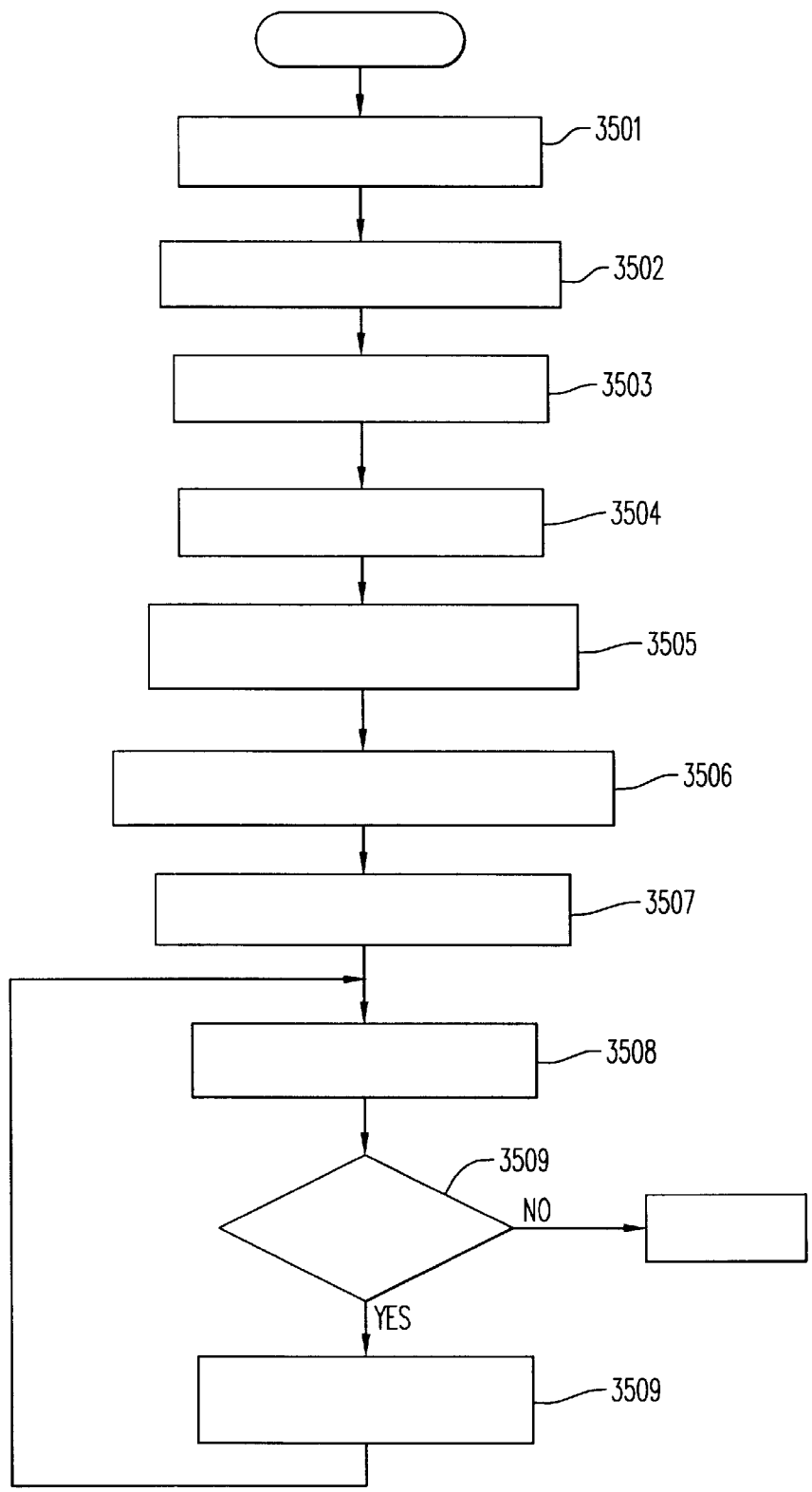
FIG. 35 is a diagram for explaining the operating algorithm of an embodiment of the circuit for calibrating the NLTS correction value of the present invention.

The calibration algorithm of this calibration circuit will be described while referring to FIGS. 19 through 22, taking as an example the case where T (channel clock period)=2,000 ps and the difference in the amount of delay between delay lines $DL_0$ and $DL_1$ is calibrated using 2T-2T signal and 3T-1T signal as the calibration signals. This flow chart is shown in FIG. 35. Here, the 2T-2T signal is signal that repeats the transition every 2 periods of the channel clock, that is, is the 2T-2T signal as is shown in FIG. 19. Similarly, the 3T-1T signal is signal that repeat the down transition every 3 periods of the channel clock and the up transition every period alternately, that is, the 3T-1T signal as is shown in FIG. 19. The signals in the present invention are not limited to the aforementioned signals, and the 2T-2T signal may be alternatively nT-nT signal (n is a natural number) and the 3T-1T signal may be alternatively (n+m)T-(n-m)T signal (m is a natural number and n>m).

(Procedure 1)

2T-2T signal that is not corrected by this NLTS correction circuit is generated (3501). These 2T-2T signals is "1100" signal generated by the HDD tester based on the recording channel clock and passes through only one delay line (for instance, $DL_0$) with no switching of delay lines. In short, the entire waveform will be delayed by just the amount of delay of the delay line through which it has passed, therefore, it will have no change in the duty ratio. The output of D/V converter 1801 at this time is measured by A/D converter 1802 and is regarded as the reference signal for delta–t=0 and is stored as V(0)(3502).

The recording channel clock is usually generated by a crystal oscillator and therefore, a very high frequency precision of several 10 ppm can be expected. In the present embodiment, it is T=2,000 psec and therefore, 2,000 psec×[several 10 ppm]/1,000,000=0.1 psec.

This is as much as 2 places more accurate than the desired precision of 10 psec. Consequently, this 2T-2T signal can be regarded as the reference duty cycle of 50%, which is needed for sufficient precision. Therefore, the D/V conversion output when the 2T-2T signal is input can be regarded as V(0) (3502).

Figure 20:
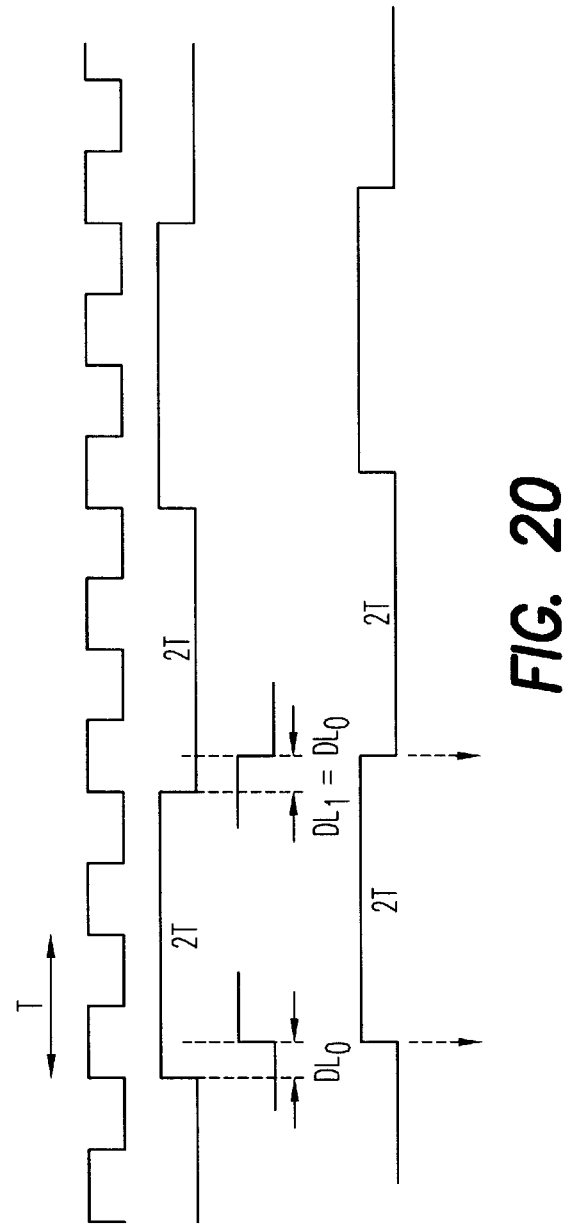
FIG. 20 is a diagram for explaining the calibration algorithm of the circuit for calibrating the amount of NLTS correction shown in FIG. 18.

The reason why this 2T-2T signal can be used as the reference signal of delta–t=0 will now be explained while referring to FIG. 20. The fact that the amount of NLTS correction is delta–t is zero means that the NLTS correction circuit does not alter the transition distance, therefor the state of calibration to $DL_1=DL_0$ in FIG. 20 corresponds to this case. Thus, the NLTS-corrected input and output have similar waveform (delayed by $DL_0$ entirely). Thus, the 2T-2T signal can be regarded as a exemplar of NLTS correction circuit output when delta–t=0 and as a result, can be used as the reference signal for delta–t=0.

(Procedure 2)

Figure 3:
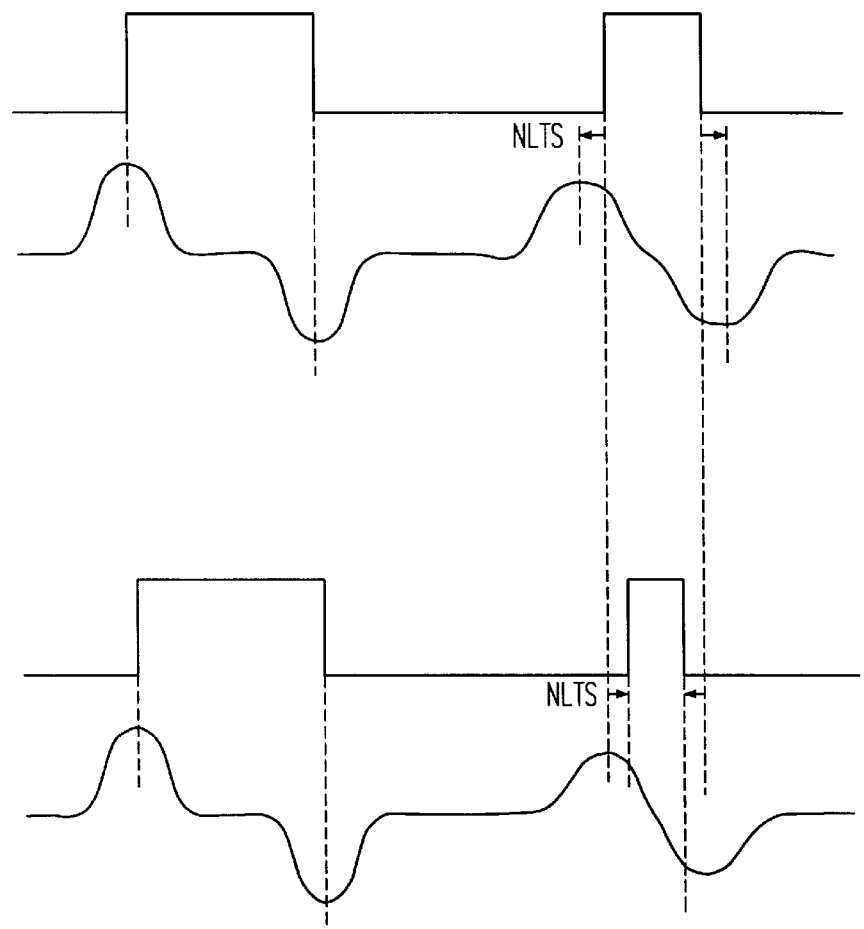
FIG. 3 is a schematic illustration showing the waveform of signals to be recorded and regeneration signals of an HDD before NLTS correction and the waveform of signals to be recorded and regeneration signals of an HDD after NLTS correction.
Figure 4:
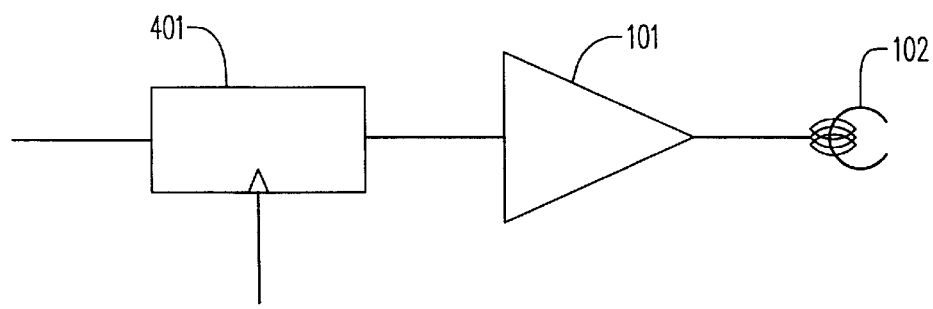
FIG. 4 is a block diagram showing a data recording device.
Figure 5:
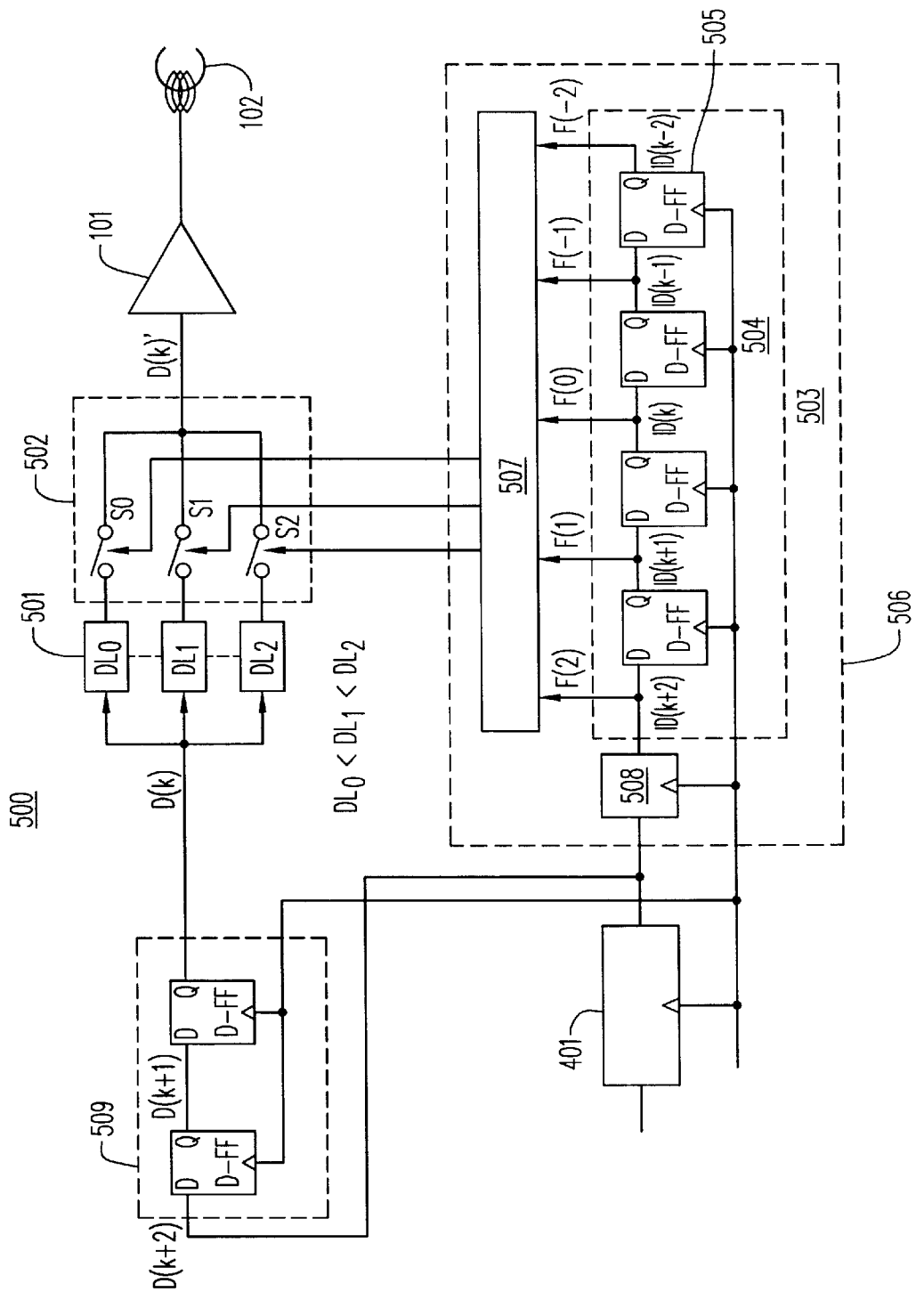
FIG. 5 is a block diagram showing a conventional NLTS correction circuit.
Figure 6:
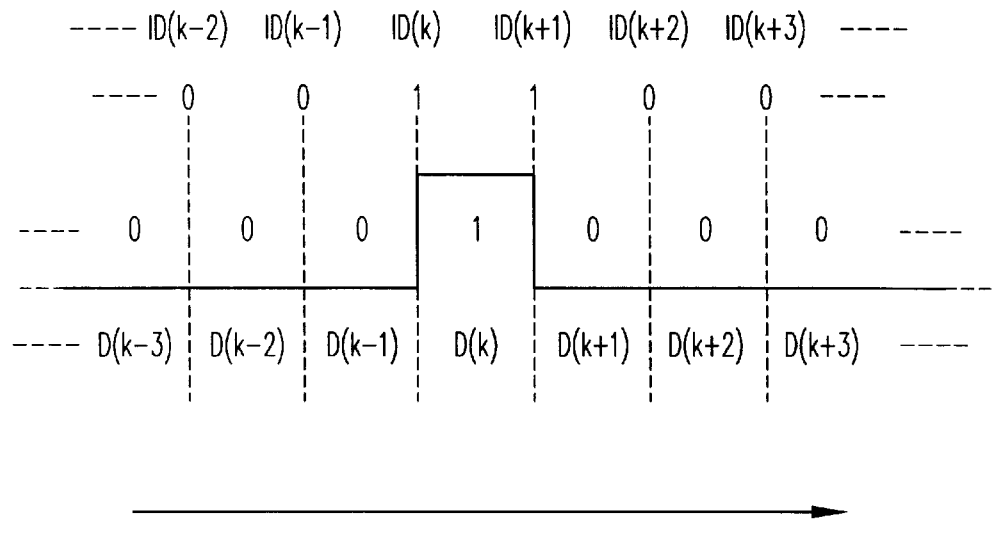
FIG. 6 is a block diagram showing a conventional data pattern analyzer.

As shown in FIG. 19, 3T-1T signal is generated as the reference signals for delta–t=T without delay correction, as in the case of the 2T-2T signal (3503). The time precision of this signal is high for the same reason as in Procedure 1. The output of D/V converter 1801 in this case is measured by AD converter 1802 and is stored as V(T) (3504).

Figure 21:
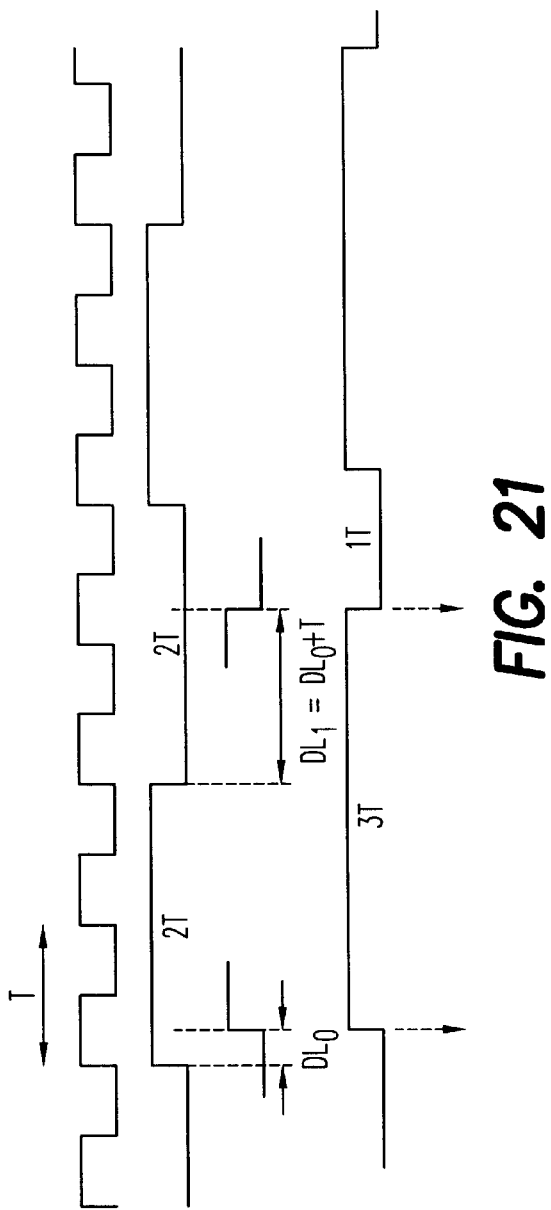
FIG. 21 is a diagram for explaining the calibration algorithm of the circuit for calibrating the amount of NLTS correction shown in FIG. 18.

Here, the reason why the 3T-1T signals can be regarded as the reference signal for delta–t=T will be explained while referring to FIG. 21. FIG. 21 represents the state of calibration to $DL_1=DL_0+T$. That is, even though the input of the NLTS correction circuit is the 2T-2T signal, the circuit has been set at Delta-t=$DL_1-DL_0$=$(DL_0+T)-DL_0$=T and therefore, the output of the NLTS correction circuit has a waveform similar to that of the 3T-1T signal. Consequently, the 3T-1T signal can be regarded as a exemplar of NLTS correction circuit output when delta–t=T and can be used as a reference signal for delta–t=T.

(Procedure 3)

Figure 22:
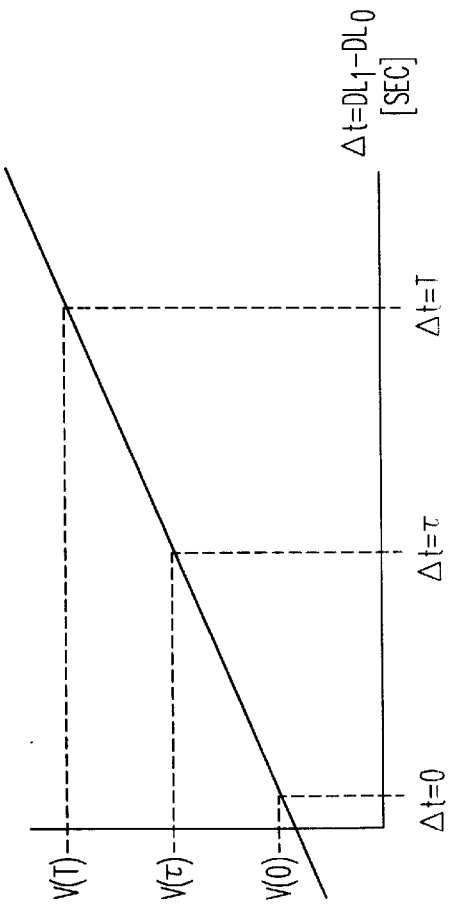
FIG. 22 is a diagram for explaining the calibration algorithm of the circuit for calibrating the amount of NLTS correction shown in FIG. 18.

Linear interpolation between V(0) and V(T) is performed as shown in FIG. 22 using reference voltages V(0) and V(T) obtained by the Procedures 1 and 2 and output voltage V(t) for desired calibration target delta–t=t (sec) is calculated by the following formula (formula 1) (3505).

$$V(t)=[(V(T)-V(0))/T]\times t+V(0) \quad (1)$$

(Procedure 4)

The 2T-2T signal, where the up transition time is defined by the $DL_0$ output signal and where the down transition time is defined by the $DL_1$ output signal is generated (3506).

(Procedure 5)

$DL_1$ is adjusted for desired calibration target delta–t=t (sec) so that the output voltage of the D/V converter becomes the value V (t) calculated by formula (1) (3507–3510). This method of adjustment is explained in detail below:

(1) First, the difference in the amount of delay between 2 delay lines is set at the minimum value (3507). This is performed by controlling the two delay lines with the same control values.

(2) The output of the D/V converter at this time is monitored (3508) If this output is smaller than the calibration target value V (t) (3509), the amount of delay of the second delay line (in this case, $DL_1$) is increased by a very small amount (3510). This can be accomplished by increasing the control value of the second delay line, for instance, by one step of the control value.

(3) Step (2) is repeated until the output of the D/V converter is equal to the calibration target V(t).

The difference in the amount of delay between each of the other delay lines should then be calibrated by the same procedure.

The D/V converter used in this calibration circuit can be any conventional D/V converter. The D/V converter is not limited to the aforementioned embodiment and is only limited by the scope of the claims.

Next, an alternative embodiment of the device for calibrating the NLTS correction value will be described while referring to FIG. 23. This embodiment is characterized by the fact that the NLTS correction value is calibrated by detecting the transition time using the spectrum of the record data signals that are output from the recording amplifier. This technique utilizes the phenomenon where when the signal transitions appear at regular intervals, that is, the duty cycle of these signals is 50%, and the waveform is symmetric, the even harmonic in this signal is zero.

Figure 23:
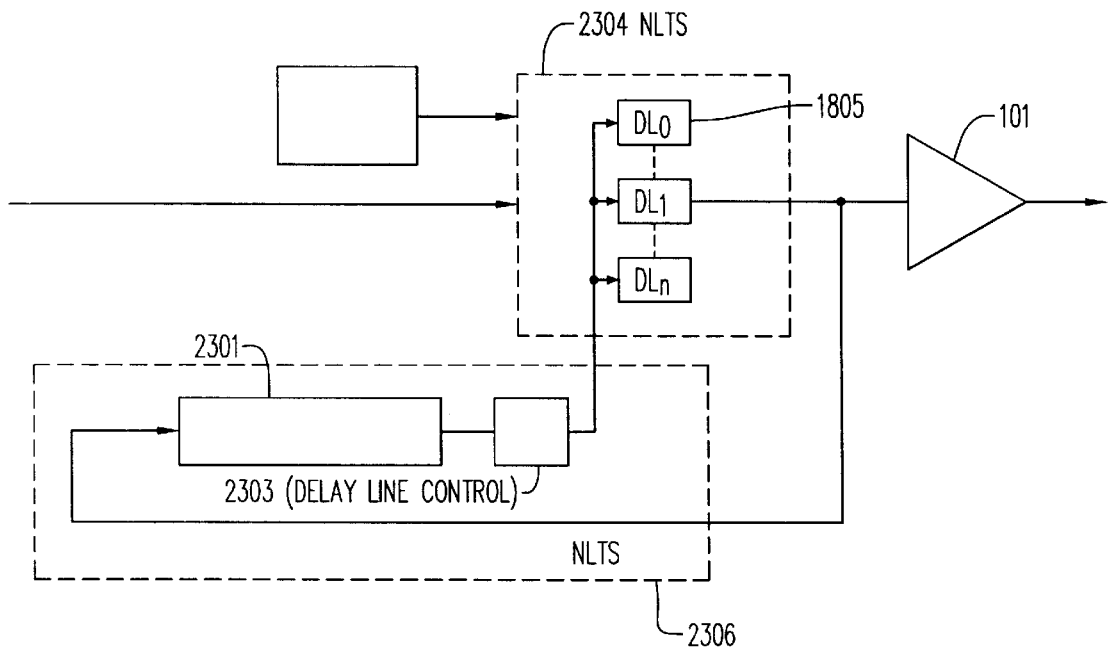
FIG. 23 is a block diagram of an embodiment of the NLTS correction circuit equipped with the circuit for calibrating the NLTS correction value of the present invention.

FIG. 23 shows NLTS correction circuit 2304 with device 2306 for the calibrating the NLTS correction value of the present invention. The current signal that has been output from recording amplifier 101 are retrieved by a current probe, etc., (not illustrated) and are analyzed by spectrum analyzer 2301. The spectrum analyzer may be conventional. The output of the spectrum analyzer 2301 is sent to delay line control device 2303. The delay line control device 2303 controls the amount of delay of each delay line 2305, as in the aforementioned embodiment, in accordance with the output of the spectrum analyzer.

Figure 36:
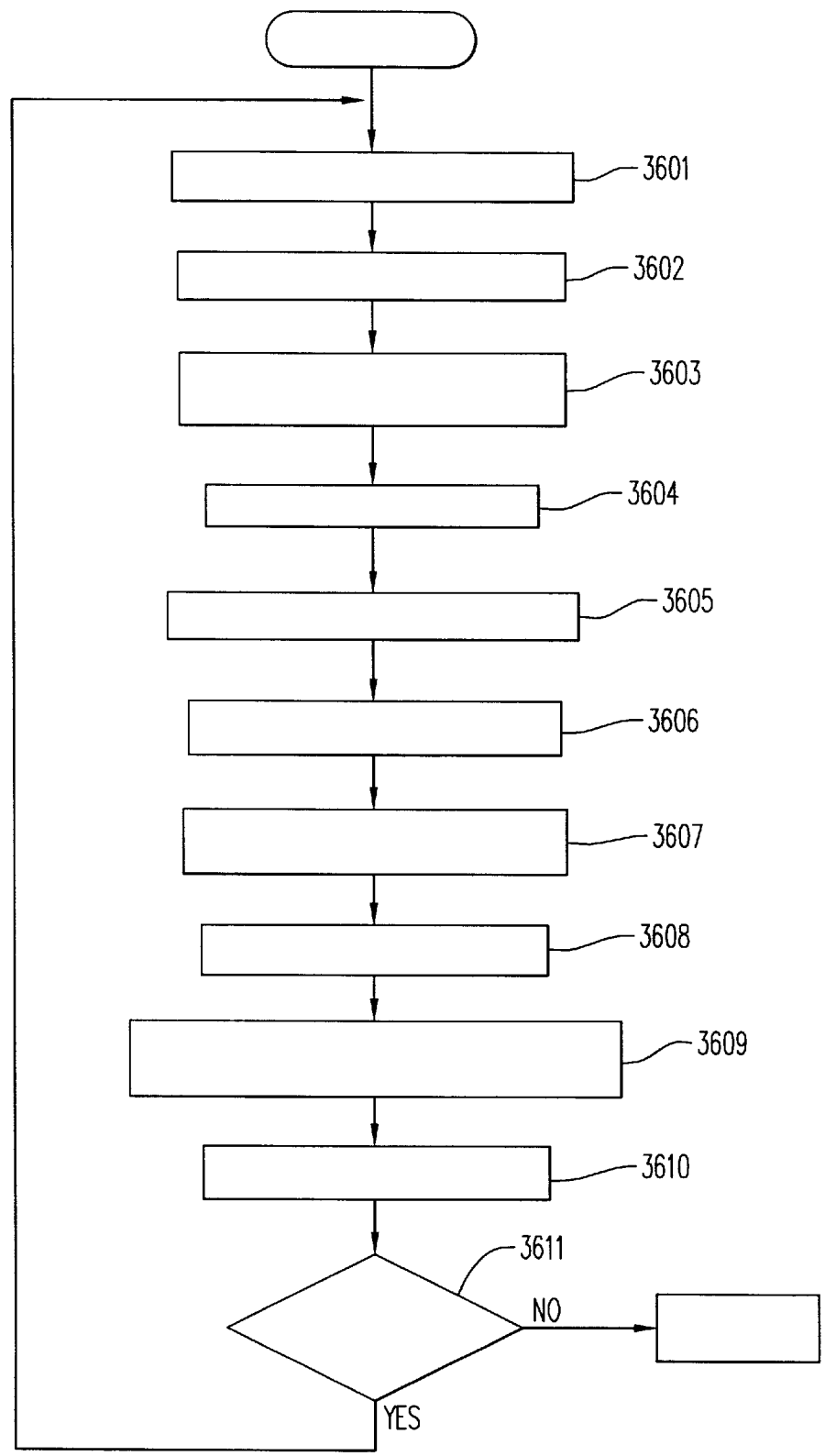
FIG. 36 is a diagram for explaining the operating algorithm of an embodiment of the circuit for calibrating the NLTS correction value of the present invention.

Calibration procedure in this embodiment will be explained below for the case where, as an example, the difference in the amount of delay correction between $DL_0$ and $DL_1$ is calibrated. This flow chart is shown in FIG. 36. Moreover, the 2T-2T signal and 1T-3T signal in the following description are respectively just only one embodiment of the present invention, and the present invention is not limited to these signals. In a preferred embodiment of the present invention, 2T-2T signal may be employed as the nT-nT signal (n is a natural number) and 1T-3T signal may be employed as the (n−m)T-(n+m) signal (m is a natural number and here n>m).

(Procedure 1)

Coarse tuning of $DL_1$ is performed to obtain $DL_1=DL_0$ (i.e., delta–t is nearly equal to 0) (3601). The coarse tuning referred to herein means to adjust the amount of delay of delay lines by controlling delay line 3200 (refer to FIG. 32) by a known delay line control code and selecting delay cells 3201 the number of which realizes the desired delay. In this case, there is an error component included in the amount of delay of each delay cell and therefore, as a whole, the desired amount of delay is not necessarily obtained.

(Procedure 2)

Figure 24:
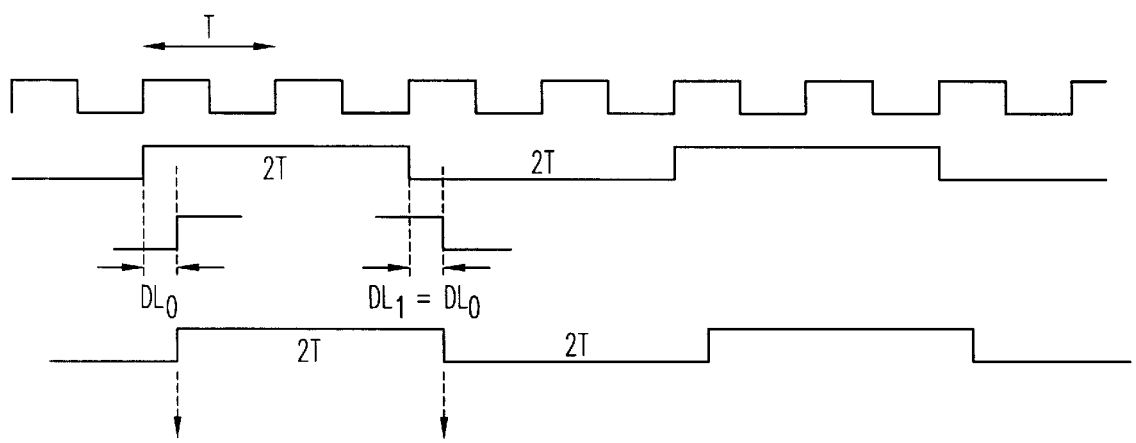
FIG. 24 is a diagram for explaining the calibration algorithm of an embodiment of the NLTS correction circuit equipped with the circuit for calibrating the amount of NLTS correction in FIG. 23.

2T-2T signals are generated by NLTS correction circuit 2304 in this state (3602), where the time of up transition is defined by $DL_0$ and the time of down transition is defined by $DL_1$. Delta-t has already been coarse-tuned to 0 approximately and therefore, rough 2T-2T signal will be output if 2T-2T signals are input to NLTS correction circuit 2304 (refer to FIG. 24).

(Procedure 3)

$DL_1$ is fine-tuned so that the even harmonics of the output signals from NLTS correction circuit 2304 are minimized (3603). The term "fine tuning" here means to adjust the amount of delay by shifting the delay line control code by, for instance, one by one from the code that has been roughly selected by the coarse tuning so that the optimum control code is found. The DL, control code value when fine tuning has been performed serves as D(0) which is used as the reference control code for delta-t=0. Thus, the situation where the even harmonics in the output signals are minimized means the situation where the NLTS-corrected waveform has been adjusted so that length of "high" period is the same as that of "low" period. Alternatively, the precision of the channel clock period is extremely high, therefore, this situation can be regarded as the situation where $$DL_0 = DL_1$$

That is, delta-t=0. Thus, this control code serves as the reference control code for delta-t=0 and is stored as D(0) (3604).

(Procedure 4)

$DL_1$ is coarse-tuned so that delta-t is nearly equal to T(3605). This can be accomplished by the same method as in Procedure 1.

(Procedure 5)

Figure 25:
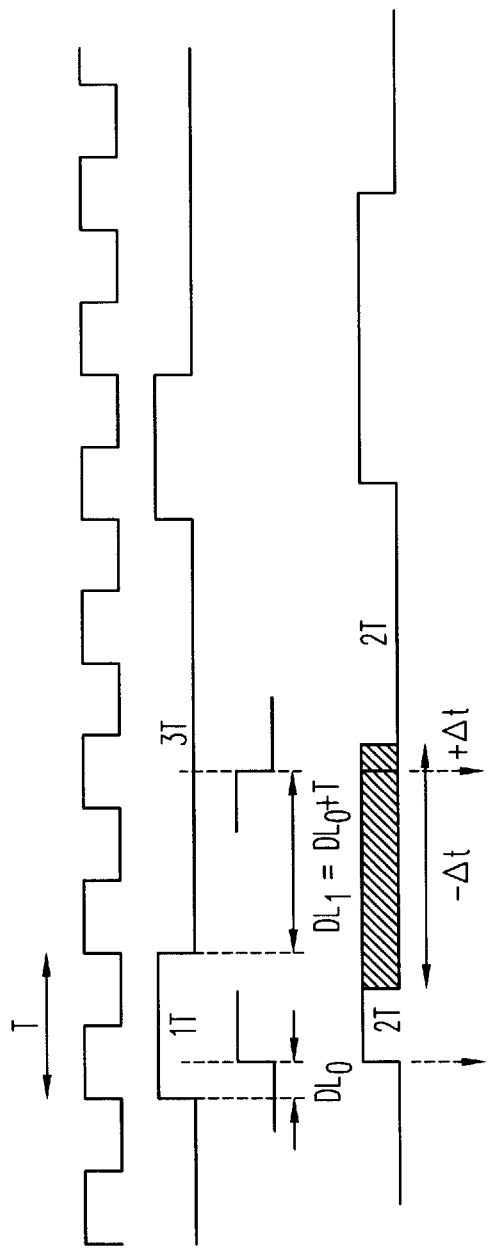
FIG. 25 is a diagram for explaining the calibration algorithm of an embodiment of the NLTS correction circuit equipped with the circuit for calibrating the amount of NLTS correction in FIG. 23.

1T-3T signal is generated in the NLTS correction circuit in this situation (3606). Here, the time of up transition is defined by $DL_0$ and the time of down transition is defined by $DL_1$. Delta-t has already been coarse tuned to T and therefore, rough 2T-2T signal is generated in the output when 1T-3T signal is input to the NLTS correction circuit (refer to FIG. 25).

(Procedure 6)

$DL_1$ is fine-tuned so that the even harmonics are minimized in the signals output from the NLTS correction circuit (3607). The $DL_1$ control value at this time serves as D(T) and this is defined as the reference control code for delta-t=T. The situation where the even harmonics in the output signal are minimized means the situation where the NLTS-corrected waveform has been adjusted so that length of "high" period is the same as that of "low" period. Additionally, the precision of the channel clock period is very high and therefore, the situation can be regarded as the situation where $$DL_1 = DL_0 + T$$

That is, delta-t=T. Thus, this control code serves as the reference code for delta-t=T and is stored as D(T) (3608).

(Procedure 7)

Figure 26:
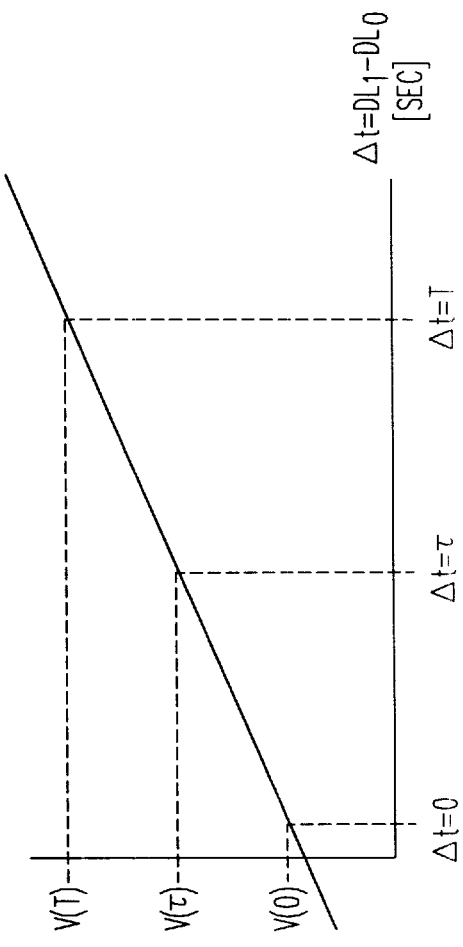
FIG. 26 is a diagram for explaining the calibration algorithm of an embodiment of the NLTS correction circuit equipped with the circuit for calibrating the amount of NLTS correction in FIG. 23.

Linear interpolation between D(0) and D(T) is performed as shown in FIG. 26 using the reference control values D(0) and D(T) obtained by the aforementioned procedures. Then, delay line control value D(t) for any calibration target delta-t=t (sec) is calculated from the following formula (formula 2) (3609) and DL, is controlled by this control value (3610).

$$D(t)=[(D(T)-D(0))/T] \times t + D(0) \tag{2}$$

The rest of the control lines are similarly controlled by finding their calibration target control value (3611).

This embodiment is the method whereby the frequency precision of the crystal oscillator serves as the reference. In this way, when the variable range of delta-t is represented by the oblique-line shading in FIG. 25, it is possible to very accurately set the time of down transition defined by $DL_1$ at any time within the range shown by the oblique lines. However, in the case of the present embodiment, the variable range of delta-t must be T or higher.

Figure 29:
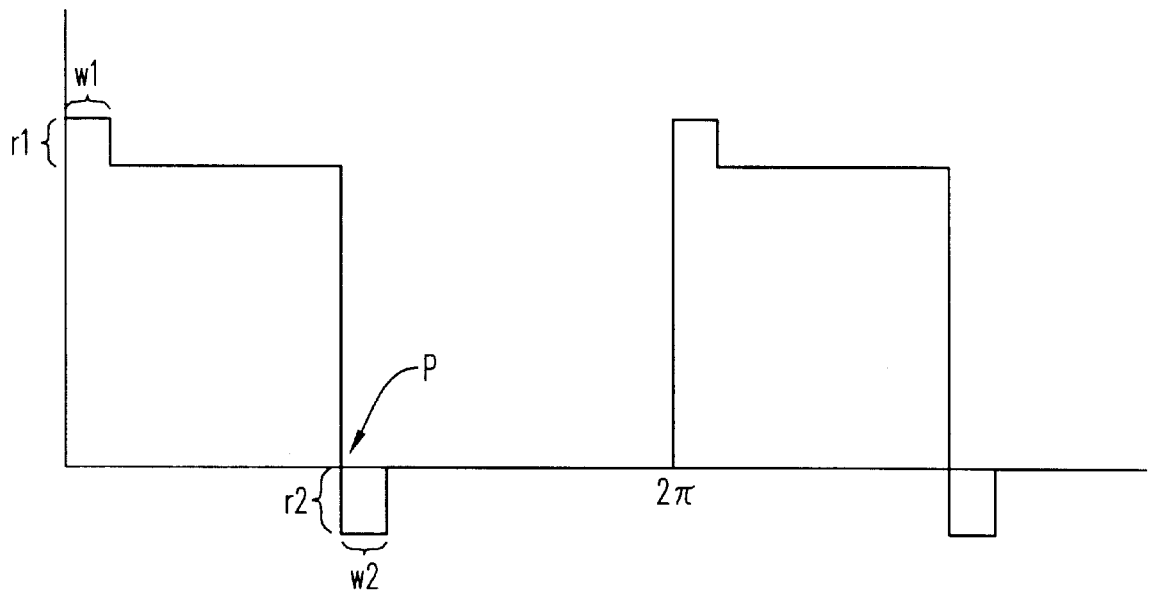
FIG. 29 is a diagram of an example of output signals of the NLTS correction circuit where there is ringing of different waveforms in the up/down transitions.

Nevertheless, in the present embodiment the problem is that if waveform distortion occurs in the output from the NLTS correction circuit, the precision will decrease. When ringing of different waveforms (asymmetric ringing) is present in the up-down transitions and ideal 2T signals cannot be obtained, the NLTS correction circuit output signals will not have symmetric waveform, as shown in FIG. 29. Thus, an even-harmonic distortion components are included in the NLTS correction circuit output signals and the calibration precision of the circuit based on the present embodiment will decrease accordingly.

Figure 27:
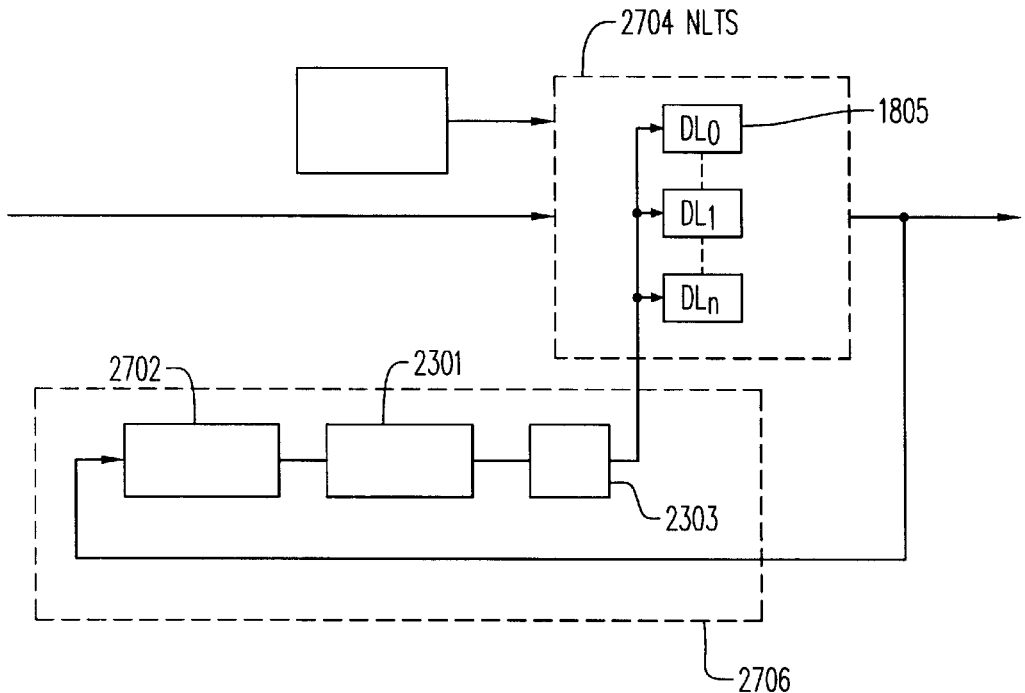
FIG. 27 is a block diagram of an embodiment of the NLTS correction circuit equipped with the circuit for calibrating the NLTS correction value of the present invention.

This point can be improved by using transition pulse generator 2702 before the spectrum analyzer 2301, as shown in FIG. 27. This improved device 2706 for calibrating the NLTS correction value is characterized by the fact that it detects the transition time using the spectrum of a series of transition pulses and controls the delay line so that the exact 2T-2T signal will be generated as in the aforementioned embodiment. However, the present embodiment differs from the aforementioned embodiment in that the effect of asymmetric ringing can be eliminated.

Figure 30:
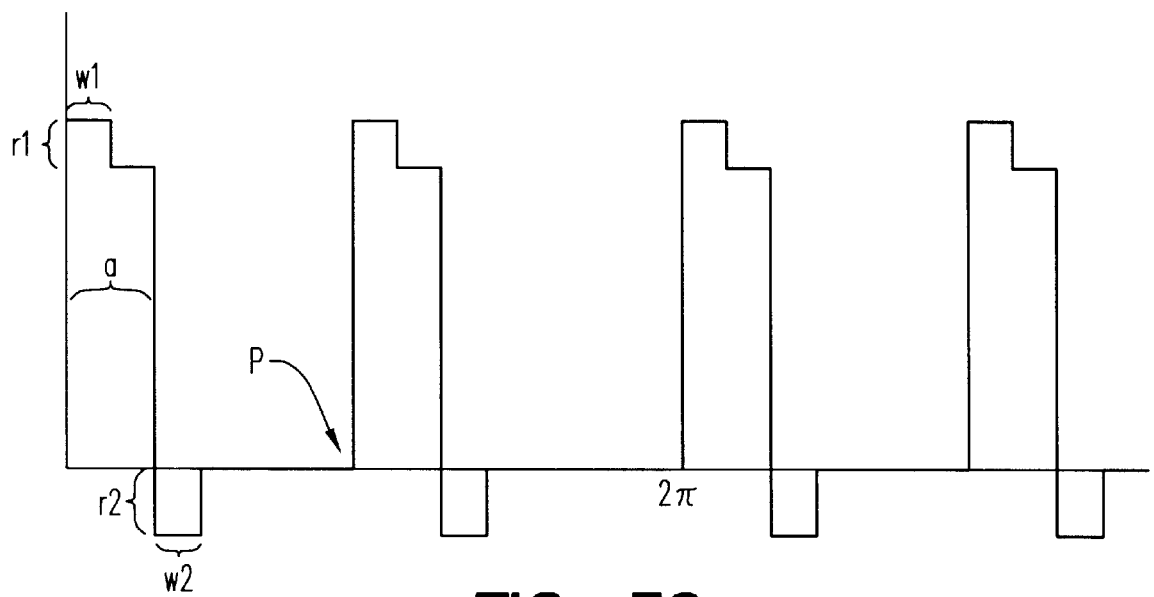
FIG. 30 is a diagram showing an example of the transition pulses that have asymmetric ringing, which were converted from the transition pulse generator.

The waveform in FIG. 30 is an example of the transition pulse that includes asymmetric ringing, which was converted by transition pulse generator 2702. This transition pulse has pulse width a and r1×w1 and r2×w2 asymmetric ringing, as shown in FIG. 30, where p represents the phase of the down transition of the correction circuit output. The theory of calibration in the present embodiment will be described using the following Fourier transform formulas in accordance with this transition pulse example.

Fourier transform is defined by the following formulas:

[Mathematical formulas 1]

$$f(t) = \frac{a_n}{2} + \sum_{n=1}^{\infty} (a_n \text{Cos } nt + b_n \text{Sin } nt) \tag{3}$$

$$a_n = \frac{1}{\pi} \int_0^{2\pi} f(t) \text{Cos } nt \, dt \tag{4}$$

$$b_n = \frac{1}{\pi} \int_0^{2\pi} f(t) \text{Sin } nt \, dt \tag{5}$$

When the values r1, w1, r2, w2, a and p are substituted for the appropriate factor in the above equations and they are solved, $a_n$ and $b_n$ are represented by the following formulas:

[Mathematical formulas 2]

$$a_n = \frac{1}{\pi}\left[\int_0^{wl}(1+rl)\cos nt\, dt + \int_{wl}^{a}\cos nt\, dt + \int_{a}^{a+w2}-r2\cos nt\, dt + \int_{p}^{p+wl}(1+rl)\cos nt\, dt + \right. \quad (6)$$
$$\left. \int_{p+wl}^{p+a}\cos nt\, dt + \int_{p+a}^{p+a+w2}-r2\cos nt\, dt\right]$$
$$= \frac{1}{n\pi}[rl\,\sin nwl + (1+r2)\sin na - r2\,\sin n(a+w2) + rl\,\sin n(p+wl) -$$
$$(1+rl)\sin np + (1+r2)\sin n(p+a) - r2\,\sin n(p+a+w2)]$$

$$b_n = \frac{1}{\pi}\left[\int_0^{wl}(1+rl)\sin nt\, dt + \int_{wl}^{a}\sin nt\, dt + \int_{a}^{a+w2}-r2\sin nt\, dt + \int_{p}^{p+wl}(1+rl)\sin nt\, dt + \right. \quad (7)$$
$$\left. \int_{p+wl}^{p+a}\sin nt\, dt + \int_{p+a}^{p+a+w2}-r2\sin nt\, dt\right]$$
$$= -\frac{1}{n\pi}[rl\,\cos nwl - (1+rl) + (1+r2)\cos na - r2\,\cos n(a+w2) + rl\,\cos n(p+wl) -$$
$$(1+rl)\cos np + (1+r2)\cos n(p+a) - r2\,\cos n(p+a+w2)]$$

The duty cycle of the 2T-2T signal is 20%, which means p=pi, therefore, the following formulas (8) and (9) are obtained by substituting pi for p in the formulas (6) and (7).

[Mathematical formulas 3]

$$a_n = \frac{1}{nx}[rl\,\sin nwl + (1+r2)\sin na - \quad (8)$$
$$r2\,\sin(na+nw2) + rl\,\sin(n\pi+nwl) - (1+rl)\sin n\pi +$$
$$(1+r2)\sin(n\pi+na) - r2\,\sin(nx+na+nw2)]$$

$$b_n = \quad (9)$$
$$-\frac{1}{n\pi}[rl\,\cos nwl - (1+rl) + (1+r2)\cos na - r2\,\cos(na+nw2) +$$
$$rl\,\cos(n\pi+nwl) - (1+rl)\cos n\pi +$$
$$(1+r2)\cos(n\pi+na) - r2\,\cos(n\pi+na+nw2)]$$

Here, when we consider the case where n is an even number and the case where n is an odd number, $a_n$ and $b_n$ can be represented as follows:

[Mathematical formulas 4]
When n=odd number, $$a_n = \frac{1}{n\pi}[rl\,\sin nwl + (1+r2)\sin na - r2\,\sin(na+nw2) - \quad (10)$$
$$rl\,\sin nwl - (1+r2)\sin na + r2\,\sin(na+nw2)] = 0$$

$$b_n = \quad (11)$$
$$-\frac{1}{n\pi}[rl\,\cos nwl - (1+rl) + (1+r2)\cos na - r2\,\cos(na+nw2) -$$
$$rl\,\cos nwl - (1+rl)(-1) -$$
$$(1+r2)\cos na + r2\,\cos(na+nw2)] = 0$$

When n=even number

Consequently, when the odd number-ordered component of the transition pulse signals is zero, p=pai That is, this can be regarded as the time when the exact 2T-2T signal is obtained. Therefore, calibration with no effect of ringing is realized by the present embodiment, because the calibration has no connection with ringing as long as the pulse interval of the transition pulse is equal.

The basic procedures of calibration by the present embodiment (FIG. 27) are the same as in the aforementioned embodiment (FIG. 23), with the differences in the calibration conditions of the two embodiments being summarized as follows:

TABLE 4

| Embodiment | Subject of measurement | Calibration conditions |
|---|---|---|
| FIG. 23 | NT signals | The even harmonic is zero. |
| FIG. 27. | Transition pulses | The odd harmonic is zero. |

Figure 37:
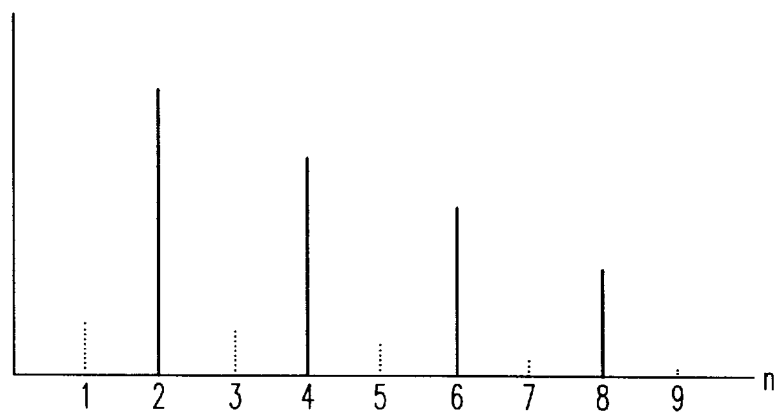
FIG. 37 is a figure showing the spectrum monitored by the spectrum analyzer in one embodiment of the circuit for calibrating the NLTS correction value of the present invention.

That is, if the intervals between transition pulses are not equal, spurious occurs at frequency where n is an odd number as with the waveform shown by the broken line in FIG. 37, and therefore, the delay line should be fine-tuned (this is the same as the fine tuning in the embodiment in FIG. 23), so that this component is minimized.

Figure 28:
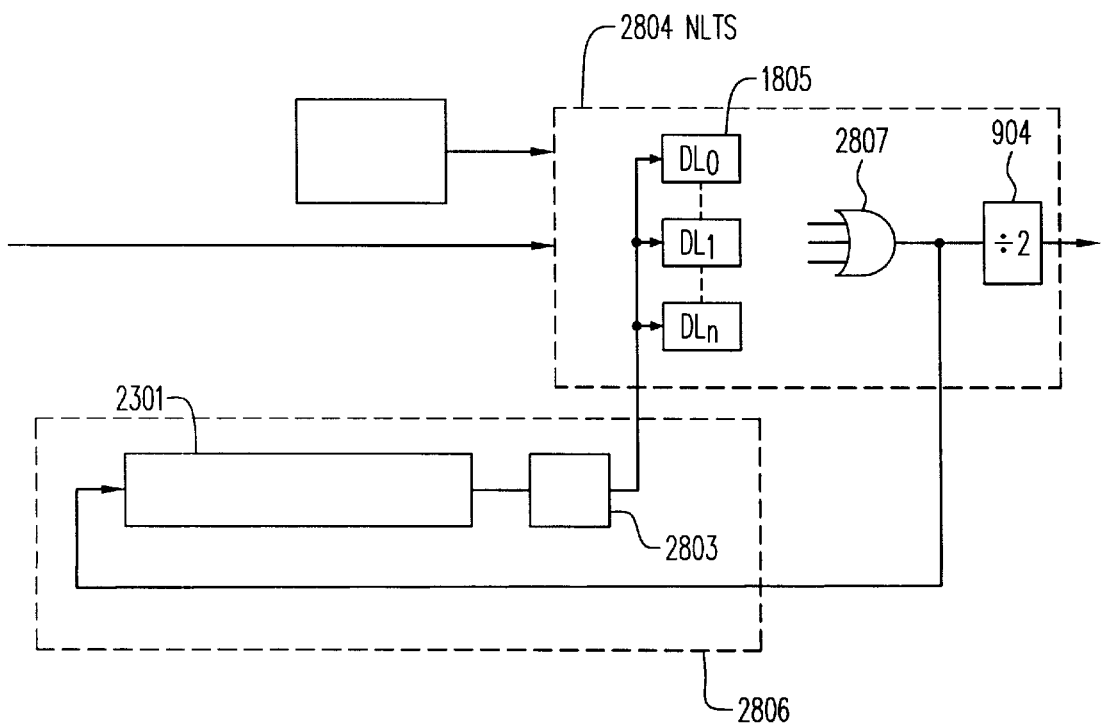
FIG. 28 is a block diagram of an embodiment of the NLTS correction circuit equipped with the circuit for calibrating the NLTS correction value of the present invention.

The embodiment in FIG. 27 can be used for all of the aforementioned NLTS correction circuits, but since the output of each logical operation device in the NLTS correction circuits with transition pulse generators in FIGS. 9, 11, 12, 13, and 17 is the transition pulse signal, the signal from the output of logical operation device 2807 of the NLTS $$a_n = \frac{1}{nx}[rl\,\sin nwl + (1+r2)\sin na - r2\,\sin(na+nw2) + rl\,\sin nwl + (1+r2)\sin na - r2\,\sin(na+nw2)] \quad (12)$$
$$= \frac{2}{n\pi}[rl\,\sin nwl + (1+r2)\sin na - r2\,\sin(na+nw2)]$$

$$b_n = -\frac{1}{n\pi}[rl\,\cos nwl - (1+rl) + (1+r2)\cos na - r2\,\cos(na+nw2) + rl\,\cos nwl - (1+rl)(1) + (1+r2)\cos na - r2\,\cos(na+nw2)] \quad (13)$$
$$= -\frac{2}{nx}[rl\,\cos nwl - (1+rl) + (1+r2)\cos na - r2\,\cos(na+nw2)]$$

correction circuit can be directly introduced to spectrum analyzer 2301, as shown in FIG. 28. The same results as in the embodiment in FIG. 27 are obtained when this type of circuit 2806 is employed for calibrating the NLTS correction value.

As was previously explained in detail, by means of the present invention, it is possible to improve the precision and resolution of the delay mount of the delay lines by adding a circuit for calibrating the NLTS correction value in the NLTS correction circuit in accord with the invention hereof. In particular, even if asymmetric ringing is contained in output signals of the NLTS correction circuit, calibration without affection of the ringing is realized.

The present invention has been described in detail with preferred embodiments, but it goes without saying that the aforementioned embodiments can be modified and altered as long as they do not deviate from the core of the present invention. Consequently, the scope of the present invention is only limited to the details of the claims appended hereto.

What is claimed is:

1. A circuit for calibrating the amount of delay of plural delay lines, comprising:

a duty cycle-voltage converter coupled to outputs from said delay lines for receiving data signals output from each of said delay lines and for converting a duty cycle of the signals to a voltage value, and outputting the voltage value, an A/D converter for converting the voltage value from an analog value to a digital value and outputting the digital value, and a delay line control device coupled to the plurality of delay lines for calculating a voltage that corresponds to a desired difference in an amount of delay between each of the delay lines in accordance with the digital value output by the A/D converter, and for controlling an amount of delay of each of the delay lines in accordance with the digital value.

2. The circuit in claim 1, wherein the duty cycle-voltage converter further comprises:

a reference current source, a comparator connected to said reference current source, a low-pass filter connected to an output of said comparator, and a current-voltage conversion circuit connected to an output of said low-pass filter.

3. A circuit for calibrating the amount of delay of plural delay lines, comprising:

a spectrum analyzer for receiving the output signals from each of the delay lines and for analyzing a frequency spectrum of said output signals and providing an output indicative thereof, and a delay line control device coupled to said spectrum analyzer and responsive to said output therefrom for calculating a delay line control value corresponding to a desired difference in an amount of delay between each of the delay lines and for controlling an amount of delay of each of the delay lines in accordance with said control value.

4. The circuit in claim 3, further comprising:

a transition pulse generator connected between outputs of said plurality of delay lines and input of said spectrum analyzer, for generating a transition pulse to the spectrum analyzer when a transition of the output signals of the delay lines occurs.

5. A method of calibrating the amount of delay of plural delay lines, comprising the steps of:

(a) inputting a reference nT-nT signal (where n is a natural number and T is the channel clock period) to a first delay line of a first and a second delay line to be calibrated and obtaining a first signal, (b) converting a duty cycle of the first signal to a voltage value and storing the voltage value as V(0), (c) inputting a reference signal (n+m)T−(n−m)T, (n and m are natural numbers and n>m) to the first delay line and obtaining a second signal, (d) converting a duty cycle of the second signal to a voltage value and storing the voltage value as V(mT), (e) determining a calibration target value V(t) which corresponds to a desired difference in the amount of delay between the first and second delay lines, said calibration target value V(t) determined from the formula $V(t)=[(V(mT)-V(0))/mT] \times t + V(0)$, (f) delaying a first transition of said reference nT-nT signal by the amount of delay of the first delay line and delaying a second transition of said reference nT-nT signal by the amount of delay of the second delay line, outputting the delayed reference signal, (g) bringing to almost a same value the amount of delay of the first delay line and the amount of delay of the second delay line, by controlling said two delay lines with a control value, (h) performing a duty cycle-voltage conversion of the delayed reference signal obtained in the step (e), (i) increasing the control value of the second delay line by a predetermined amount when a voltage value obtained by the conversion of step (g) is smaller than the calibration target value V(t), and (j) repeating the steps (g) and (h) until the voltage value obtained by the conversion in the step (g) becomes the same as the calibration target value V(t).

6. A method for calibrating the amount of delay of a plurality of delay lines, comprising the steps of:

(a) controlling first and second delay lines which are to be calibrated by a same control value so that the amount of delay of the first and second delay lines is approximately the same, (b) delaying a first transition of a reference signal nT-nT (n is a natural number) by the amount of delay of the first delay line and delaying a second transition of the reference signal by the amount of delay of the second delay line and outputting the delay reference signal, (c) analyzing a spectrum of the delayed reference signal obtained by the step (b) and fine-tuning the second delay line so that even harmonics of the signal becomes minimized, and storing a control value for the second delay line at this time as D(0), (d) controlling, by the control value, the second delay line so that a difference in an amount of delay between the first and second delay lines is nearly equal to T, (e) delaying a first transition of a reference signal (n−m)T−(n+m)T (n and m are natural numbers and n>m) by an amount of delay of the first delay line and delaying a second transition of said reference signal(n−m)T−(n+m)T by an amount of delay of the second delay line, and outputting the signal, (f) analyzing a spectrum of the signal derived in the step (e) and fine-tuning the second delay line so that even harmonics of the signal becomes minimized, and storing the control value for the second delay line as D(mT), (g) determining a calibration target value D(t) which corresponds to a desired difference in the amount of delay between the first and second delay lines, said calibration target value D(t) determined from the formula D(t)=[(D(mT)−D(0))/mT]×t+D(0), and (h) controlling the second delay line by use of the control value determined in the step (g).

7. The method in claim 6, wherein the fine-tuning of steps (c) and (f) is performed by:

analyzing the spectrum of signals output through each delay line and gradually shifting control values by a predetermined amount from the control value roughly selected in the step (a) or step (d) until the even harmonic become minimized.

* * * * *